(12) United States Patent
Yoo et al.

(10) Patent No.: US 12,393,511 B2
(45) Date of Patent: Aug. 19, 2025

(54) MEMORY STORAGE DEVICE AND WEAR LEVELING METHOD THEREOF

(71) Applicant: SAMSUNG ELECTRONICS CO., LTD., Suwon-si (KR)

(72) Inventors: Sanghoon Yoo, Suwon-si (KR); Wan-Soo Choi, Suwon-si (KR); Hee Yeon Tak, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 14 days.

(21) Appl. No.: 18/237,735

(22) Filed: Aug. 24, 2023

(65) Prior Publication Data

US 2024/0264932 A1    Aug. 8, 2024

(30) Foreign Application Priority Data

Feb. 3, 2023    (KR) .................. 10-2023-0015032

(51) Int. Cl.
*G06F 12/02* (2006.01)

(52) U.S. Cl.
CPC .. *G06F 12/0246* (2013.01); *G06F 2212/7211* (2013.01)

(58) Field of Classification Search
None
See application file for complete search history.

(56) References Cited

U.S. PATENT DOCUMENTS

| | | |
|---|---|---|
| 8,842,472 B2 | 9/2014 | Kim |
| 8,964,481 B2 | 2/2015 | Oh et al. |
| 9,195,590 B2 | 11/2015 | Fontana et al. |
| 9,558,108 B2 | 1/2017 | Chang et al. |
| 10,353,612 B2 | 7/2019 | Kanno |
| 10,467,133 B2 | 11/2019 | Perlstein et al. |
| 11,189,351 B2 | 11/2021 | Lien et al. |
| 2016/0267004 A1 | 9/2016 | Perlstein et al. |
| 2018/0158529 A1 | 6/2018 | Goda et al. |
| 2020/0321055 A1 | 10/2020 | Yang |

(Continued)

FOREIGN PATENT DOCUMENTS

| | | | |
|---|---|---|---|
| KR | 2019087845 A | * 7/2019 | ......... G11C 16/0483 |
| KR | 10-2301772 B1 | 9/2021 | |
| KR | 10-2336919 B1 | 12/2021 | |

OTHER PUBLICATIONS

Communication dated Apr. 26, 2024 issued by the European Patent Office in European Application No. 23211024.7.

(Continued)

*Primary Examiner* — Brian R Peugh

(74) *Attorney, Agent, or Firm* — Sughrue Mion, PLLC

(57) ABSTRACT

A memory storage device is provided. The memory storage device includes: a memory device including a plurality of blocks, the plurality of blocks including a first block which includes a plurality of sub-blocks; and a memory controller configured to, based on use amount differences among the plurality of sub-blocks being greater than a threshold value, increase a use amount of a low use sub-block that has a small use amount from among the plurality of sub-blocks of the first block. The plurality of sub-blocks of the respective blocks are stacked in a direction perpendicular to a substrate of the memory device.

19 Claims, 16 Drawing Sheets

(56) References Cited

U.S. PATENT DOCUMENTS

2021/0216474 A1* 7/2021 Muchherla .......... G06F 12/0253
2021/0304822 A1    9/2021 Lien et al.

OTHER PUBLICATIONS

Yang et al., "Garbage Collection and Wear Leveling for Flash Memory: Past and Future", Smartcomp, 2014 International Conference on Smart Computing, IEEE, Nov. 3, 2014, pp. 66-73 (8 pages total).

* cited by examiner

MEMORY STORAGE DEVICE AND WEAR LEVELING METHOD THEREOF

CROSS-REFERENCE TO RELATED APPLICATION

This application claims priority to Korean Patent Application No. 10-2023-0015032, filed in the Korean Intellectual Property Office on Feb. 3, 2023, the disclosure of which is incorporated by reference herein in its entirety.

BACKGROUND

Field

The present disclosure relates to a memory storage device and a wear leveling method of the memory storage device.

Description of Related Art

A flash memory has limits in a program and an erase period. To write data to a certain address of the flash memory, an erase operation on a memory region that corresponds to the address must be performed. When an erase and write operation is repeatedly performed on a specific block in the flash memory, a lifespan of the corresponding block is reduced. To prevent unnecessary reduction of the lifespan of the specific block, a wear leveling process for uniformly performing the erase and write operation on all the blocks configuring the flash memory may be performed. However, in a multi-stack structure in which one block includes a plurality of sub-blocks, the number of erase and write operations performed on a specific sub-block may be greater than the number of erase and write operations performed on other sub-blocks in the same block, which may reduce the lifespan of all blocks due to deterioration of the specific sub-block.

SUMMARY

One or more example embodiments provide a method for performing wear leveling based on sub-block units, and a memory storage device applying the same.

According to an aspect of an example embodiment, a memory storage device includes: a memory device including a plurality of blocks, the plurality of blocks including a first block which includes a plurality of sub-blocks; and a memory controller configured to, based on use amount differences among the plurality of sub-blocks being greater than a threshold value, increase a use amount of a low use sub-block that has a small use amount from among the plurality of sub-blocks of the first block. The plurality of sub-blocks of the respective blocks are stacked in a direction perpendicular to a substrate of the memory device.

According to another aspect of an example embodiment, a memory storage device includes: a memory device including a plurality of blocks, the plurality of blocks including a first block and a second block, and the first block including a first sub-block, a second sub-block and a third sub-block sequentially stacked on a substrate; and a memory controller configured to control the memory device to duplicate data of the first sub-block or the second sub-block to the second block, erase the first sub-block or the second sub-block, and program the first sub-block or the second sub-block, based on the third sub-block being in an invalid state.

According to yet another aspect of an example embodiment, a wear leveling method of a memory storage device including a first block and a second block, the first block including a first sub-block and a second sub-block, includes: identifying an EC gap indicating a difference between a second EC value of the second sub-block and a first EC value of the first sub-block; duplicating data of the first sub-block to the second block based on the EC gap being greater than a threshold value; erasing the data of the first sub-block based on the EC gap being greater than the threshold value; and programming the first sub-block based on the EC gap being greater than the threshold value.

BRIEF DESCRIPTION OF DRAWINGS

The above and other aspects and features will be more apparent from the following description of embodiments with reference to the attached drawings, in which.

DETAILED DESCRIPTION

Figure 1:
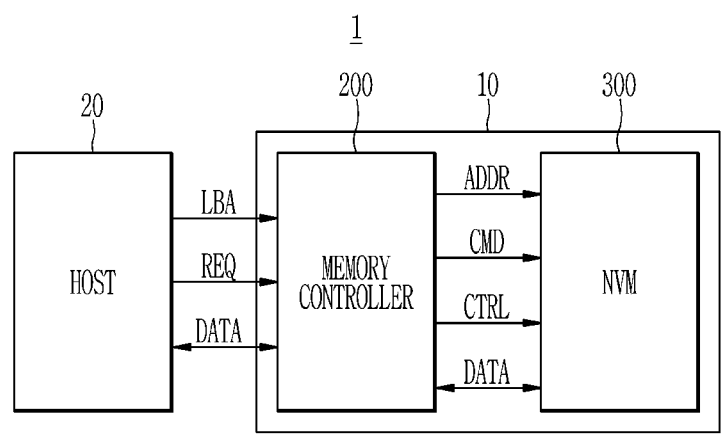
FIG. 1 shows a block diagram of an electronic device according to an example embodiment.

Example embodiments will be described more fully with reference to the accompanying drawings. In the following description, example embodiments are shown and described. As those skilled in the art would appreciate, the described examples may be modified in various different ways, all without departing from the spirit or scope of the present disclosure.

Accordingly, the drawings and description are to be regarded as illustrative in nature and not restrictive, and like reference numerals refer to similar elements throughout the specification. In the flowcharts described with reference to the drawings in this specification, the operation order may be changed, various operations may be merged, certain operations may be divided, and certain operations may not be performed.

An expression recited in the singular may be construed as singular or plural unless the expression "one", "single", etc., is used. Terms including ordinal numbers such as first, second, and the like, will be used only to describe various components, and are not to be interpreted as limiting these components. The terms may only be used to differentiate one component from others.

Methods for allocating memories according to an example embodiment may consider a use amount of sub-blocks when memory sub-blocks are allocated in response to an allocation request. For example, the sub-blocks with a lesser use amount may be allocated in advance to the sub-blocks with a greater use amount. The use amount may, for example, indicate a value of a parameter such as an erase count (EC) of a memory type with limited durability (e.g., read and/or write durability). According to example embodiments, the lifespan of the memory may be increased by allowing the sub-blocks to be more uniformly worn. The sub-block allocation method considering a wear level may be performed based on EC values of the sub-blocks for the respective blocks. For example, the EC may be used as a parameter for indicating the use amount of the memory, and a plurality of blocks with large EC gaps among the sub-blocks may be combined by a wear level block pool and may be managed. Based on the EC gap in the wear level block pool, data of a certain sub-block may be duplicated to a sub-block of another block, and the certain sub-block may be erased. The EC will be used as the parameter for indicating the use amount in the disclosure given below, and without being limited thereto, an example embodiment using other parameters such as a write count for indicating the use amount or an allocation count may correspond to the present disclosure.

Writing data may correspond to programming data in the disclosure described hereinafter.

FIG. 1 shows a block diagram of an electronic device according to an example embodiment.

As shown in FIG. 1, the electronic device 1 may include a memory storage device 10 and a host 20. The host 20 and the memory storage device 10 may be electrically connected to each other, and may transmit/receive signals to/from each other by interfaces respectively installed in the host 20 and the memory storage device 10. Data DATA, a logical block address LBA corresponding to the data DATA, and a request signal REQ for indicating a memory operation on the corresponding data may be provided to the host 100 and the memory storage device 10, and the memory storage device 10 may provide the data DATA obtained by the memory operation to the host 20 in response to the request signal REQ. The host 20 may include, for example, personal computers (PC), laptops, mobile phones, smartphones, tablet PCs, and servers.

The memory storage device 10 may include a memory controller 200 and a non-volatile memory 300. The memory storage device 10 may include an embedded Universal Flash Storage (UFS) memory device, an embedded Multi-Media Card (eMMC), or a Solid State Drive (SSD). For example, the memory storage device 10 may include an attachable/detachable UFS memory card, a Compact Flash (CF), an Secure Digital (SD), a Micro Secure Digital (Micro-SD), a Mini Secure Digital (Mini-SD), an extreme Digital (xD), or a memory stick. When the memory storage device 10 is the SSD, the memory storage device 10 may follow the non-volatile memory express (NVMe) standard.

The non-volatile memory 300 may include a NAND flash memory. However, example embodiments are not limited thereto, and the non-volatile memory 300 may include a NOR flash memory, or may include a resistive memory such as a Phase-change RAM (PRAM), a Magneto resistive RAM (MRAM), a Ferroelectric RAM (FeRAM), and a Resistive RAM (RRAM). The non-volatile memory 300 may include a plurality of blocks including a plurality of pages, and the respective blocks may include a plurality of sub-blocks.

The memory controller 200 may be connected to the non-volatile memory 300, and may control the non-volatile memory 300 to write data DATA to the non-volatile memory 300 or read data DATA from the non-volatile memory 300. For example, the memory controller 200 may generate an address ADDR, a command CMD, and a control signal CTRL on the non-volatile memory 300 according to a logical block address LBA and a request signal REQ provided by the host 100, and may provide the same to the non-volatile memory 300. The memory controller 200 may control to provide signals to the non-volatile memory 300 and write data DATA to the non-volatile memory 300 or read data DATA from the non-volatile memory 300.

Figure 2:
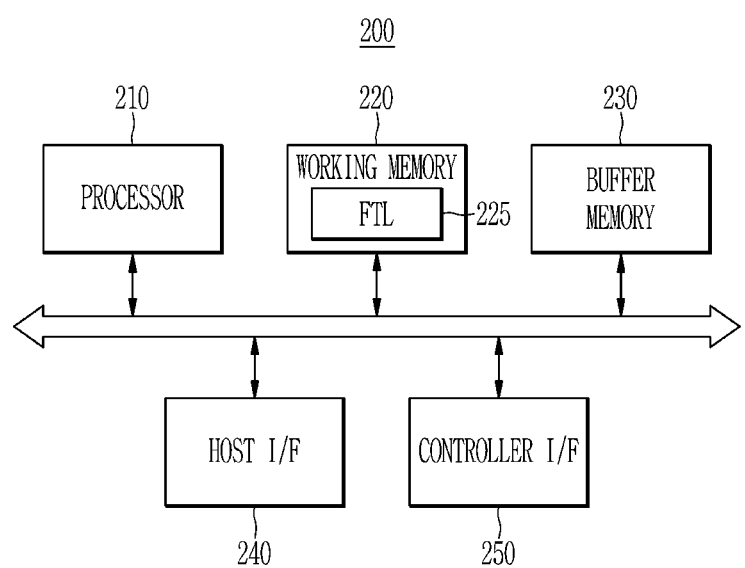
FIG. 2 shows a block diagram of a memory controller according to an example embodiment.

FIG. 2 shows a block diagram of a memory controller according to an example embodiment.

As shown in FIG. 2, the memory controller 200 may include a processor 210, a working memory 220, a buffer memory 230, a host interface 240, and a controller interface 250.

The processor 210 may include a central processing unit (CPU), a controller, or an application specific integrated circuit (ASIC). The processor 210 may control a general operation of the memory controller 200. The processor 210 may control the memory controller 200 by driving firmware loaded on the working memory 220.

The host interface 240 may transmit/receive packets to/from the host 20. The packets transmitted to the host interface 240 from the host 20 may include a command or data to be written to the non-volatile memory 300, and the packets transmitted to the host 20 from the host interface 240 may include a response to the command or the data read from the non-volatile memory 300.

The controller interface 250 may provide transmission/receiving of signals to/from the non-volatile memory 300. The controller interface 250 may transmit the command and the control signal together with the data to be written to the non-volatile memory 300 to the non-volatile memory 300, and may receive the data read from the non-volatile memory 300. The controller interface 250 may operate according to standards such as Toggle or ONFI.

The working memory 220 may include a flash transition layer (FTL) 225. The flash transition layer may include system software for managing data writing, data reading, and sub-block and/or block erasing operation of the non-volatile memory 300. For example, the flash transition layer may include firmware. The flash transition layer may be loaded on the working memory 220. The firmware of the flash transition layer may be executed by the processor 210.

The flash transition layer 225 may perform various functions such as address mapping, wear leveling, or garbage collection.

The flash transition layer 225 may perform an address mapping operation for changing the logical address provided by the host to a physical address used in storing the data in the non-volatile memory 300.

The flash transition layer 225 may perform wear leveling on a plurality of blocks so that the physical blocks (hereinafter, blocks) in the non-volatile memory 300 may be uniformly used. In addition, the wear leveling may be performed on a plurality of physical sub-blocks (hereinafter, sub-blocks) configuring the respective blocks. For example, the flash transition layer 225 may perform wear leveling so that the use amount among the sub-blocks of the respective blocks in the non-volatile memory 300 may be uniform. The flash transition layer 225 may be realized as firmware for controlling a memory operation of the sub-blocks so that EC values of the respective sub-blocks of the respective blocks may be calculated, and when an EC gap among EC values is greater than a predetermined threshold value, the EC gap may be controlled to be equal to or less than the threshold value. By this, the EC value among the sub-blocks may be balanced in the threshold range.

The flash transition layer 225 may perform garbage collection for acquiring usable capacity in the non-volatile memory 300 by duplicating valid data of a block to a new block and erasing the initial block. The garbage collection may be performed per sub-block as well as per block.

The buffer memory 230 may store code data used in initially booting the memory storage device 10. The buffer memory 230 may buffer the logical block address LBA, the request signal REQ, and the data DATA received from the host 100. The signals buffered by the buffer memory 230 may be transmitted to the non-volatile memory 300 through the controller interface 250 and may be used. For example, the data DATA buffered by the buffer memory 230 may be programmed to the non-volatile memory 300.

Figure 3:
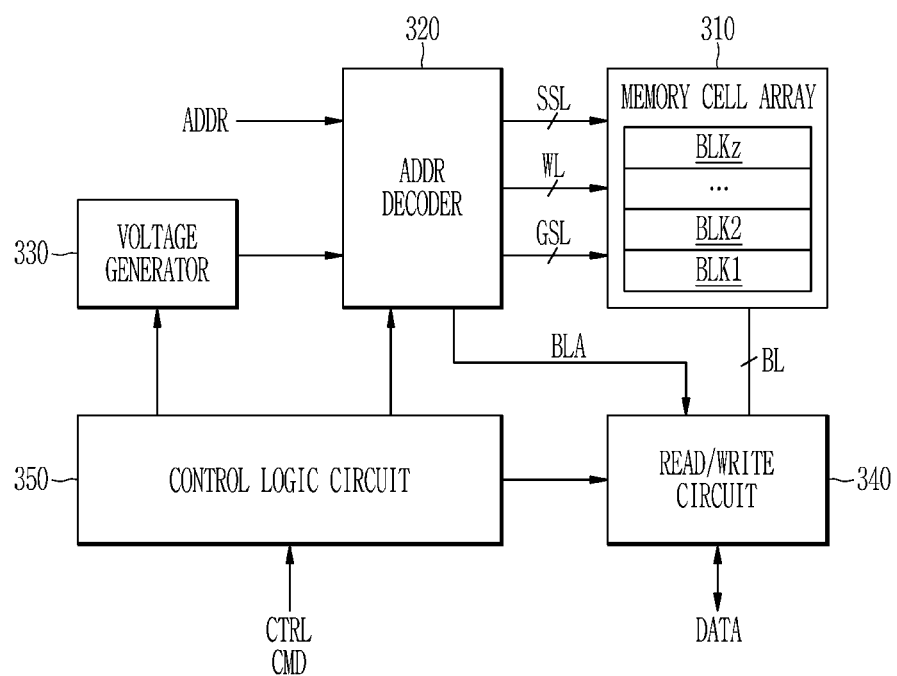
FIG. 3 shows a block diagram of a non-volatile memory according to an example embodiment.

FIG. 3 shows a block diagram of a non-volatile memory according to an example embodiment.

Referring to FIG. 3, the non-volatile memory 300 may include a memory cell array 310, an address decoder 320, a voltage generator 330, a read/write circuit 340, and a control logic circuit 350.

The memory cell array 310 may include a plurality of memory blocks BLK1 to BLKk (k is a positive integer). The memory cell array 310 may be connected to the read/write circuit 340 through bit lines BL, and may be connected to the address decoder 320 through word lines WL, string select lines SSL, and ground select lines GSL. The memory cell array 310 may be connected to the address decoder 320 through the word lines WL. The respective memory blocks BLK1 to BLKk may include memory cells, the memory cells disposed in one direction in the respective blocks may be connected to the same word line WL, and the memory cells disposed in another direction traversing the one direction may be connected to one bit line BL.

The address decoder 320 may be operable in response to control by the control logic circuit 350. The address decoder 320 may receive an address ADDR from the memory controller 200. The address decoder 320 may decode a word line address for indicating the word line based on the received address ADDR. The address decoder 320 may select the word line WL according to the word line address. The address decoder 320 may decode the bit line address BLA for indicating the bit line based on the received address ADDR, and may provide the bit line address BLA to the read/write circuit 340. The address decoder 320 may receive voltages, which may be used to program data and perform operations such as read data, from the voltage generator 330.

The voltage generator 330 may generate voltages used in an access operation according to control by the control logic circuit 350. For example, the voltage generator 330 may generate a program voltage and a program verifying voltage used in performance of program operations. For example, the voltage generator 330 may generate a read voltage for performing a read operation and may generate an erase voltage and an erase verifying voltage for performing an erase operation. The voltage generator 330 may provide voltages for performing various operations to the address decoder 320.

The read/write circuit 340 may be connected to the memory cell array 310 through the bit line BL. The read/write circuit 340 may transmit/receive data DATA to/from the memory controller 200. The read/write circuit 340 may be operable in response to control by the control logic circuit 350. The read/write circuit 340 may receive the decoded bit line address BLA from the address decoder 320. The read/write circuit 340 may select the bit line BL according to the decoded bit line address BLA.

The read/write circuit 340 may program the received data DATA to the memory cell array 310. The read/write circuit 340 may read data from the memory cell array 310, and may provide the read data to an external device (e.g., the memory controller 200). For example, the read/write circuit 340 may include a sensing amplifier, a write driver, a bit line selecting circuit, and a page buffer.

The control logic circuit 350 may transmit respective signals for controlling the address decoder 320, the voltage generator 330, and the read/write circuit 340 at corresponding times and may control the operation of the non-volatile memory 300. The control logic circuit 350 may be operated in response to a control signal CRTL and the command CMD (e.g., an erase command, a write command, and a read command) provided by the memory controller 200. The control logic circuit 350 may perform an erase operation on the sub-block indicated by the address ADDR based on the erase command CMD provided by the memory controller 200 and the sub-block-based address ADDR for the blocks configuring the memory cell array 310. For example, the control logic circuit 350 may control the voltage generator 330 and the address decoder 320 to supply the erase voltage to the word lines of the sub-block that corresponds to the address ADDR.

Figure 4:
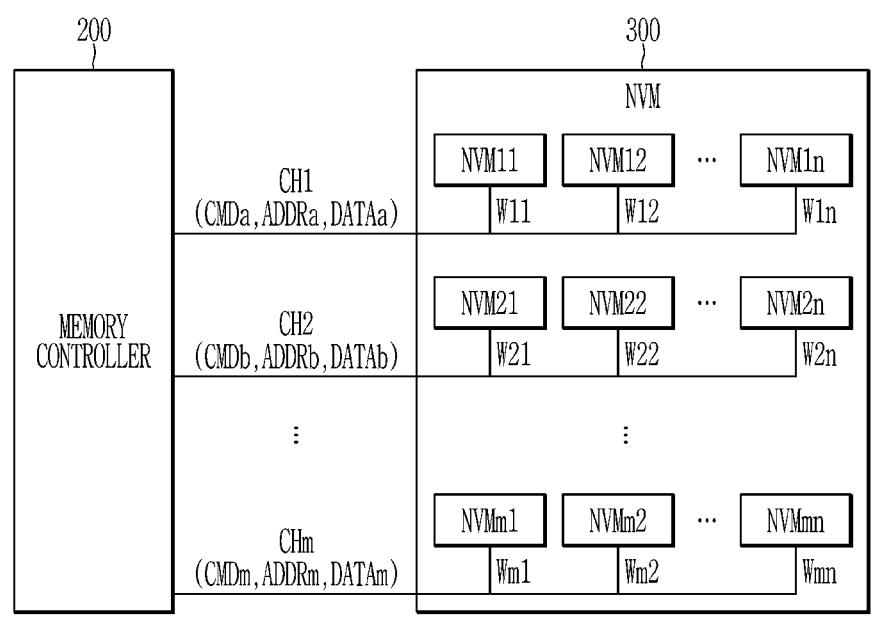
FIG. 4 shows a block diagram of a plurality of channels between a memory controller and a non-volatile memory according to an example embodiment.

FIG. 4 shows a block diagram of a plurality of channels between a memory controller and a non-volatile memory.

Referring to FIG. 4, the memory storage device 10 may include a memory controller 200 and a non-volatile memory 300. The memory storage device 10 may support a plurality of channels CH1 to CHm, and the memory controller 200 and the non-volatile memory 300 may be connected to each other through the channels CH1 to CHm. For example, the memory storage device 10 may be realized with a storage device such as the SSD.

The non-volatile memory 300 may include a plurality of non-volatile memory devices NVM11 to NVMmn. The respective non-volatile memory devices NVM11 to NVMmn may be connected to one of the channels CH1 to CHm through corresponding conductive paths. For example, the non-volatile memory devices NVM11 to NVM1$n$ may be connected to the first channel CH1 through the conductive paths W11 to W1$n$, and the non-volatile memory devices NVM21 to NVM2$n$ may be connected to the second channel CH2 through the conductive paths W21 to W2$n$. The respective non-volatile memory devices NVM11 to NVMmn may be realized with arbitrary memories that are operable according to individual commands from the memory controller 200. For example, the respective non-volatile memory devices NVM11 to NVMmn may be realized with chips or dies. However, the present disclosure is not limited thereto. The respective non-volatile memory devices NVM11 to NVMmn may include a plurality of blocks BLK1 to BLKk in a manner similar to the memory cell array 310 shown in FIG. 3, and may perform wear leveling for respective sub-blocks configuring the blocks.

The memory controller 200 may transmit/receive signals to/from the non-volatile memory 300 through the channels CH1 to CHm. For example, the memory controller 200 may transmit the commands CMDa to CMDm, the addresses ADDRa to ADDRm, and the data DATAa to DATAm to the non-volatile memory 300 through the channels CH1 to CHm, and may receive the data DATAa to DATAm from the non-volatile memory 300.

The memory controller 200 may select one of the non-volatile memory devices connected to the corresponding channels through the respective channels, and may transmit/receive signals to/from the non-volatile memory device. For example, the memory controller 200 may select the non-volatile memory device NVM11 from among the non-volatile memory devices NVM11 to NVM1n connected to the first channel CH1. The memory controller 200 may transmit the command CMDa, the address ADDRa, and the data DATAa to the selected non-volatile memory device NVM11 through the first channel CH1, and may receive the data DATAa from the selected non-volatile memory device NVM11.

The memory controller 200 may transmit/receive signals to/from the non-volatile memory 300 through different channels in parallel. For example, the memory controller 200 may transmit a command CMDb to the non-volatile memory 300 through the second channel CH2 while transmitting the command CMDa to the non-volatile memory 300 through the first channel CH1. For example, the memory controller 200 may receive data DATAb from the non-volatile memory 300 through the second channel CH2 while receiving data DATAa from the non-volatile memory 300 through the first channel CH1.

The memory controller 200 may control a data storage operation of the non-volatile memory 300. The memory controller 200 may transmit signals to the channels CH1 to CHm and may control the non-volatile memory devices NVM11 to NVMmn connected to the channels CH1 to CHm. For example, the memory controller 200 may transmit the command CMDa and the address ADDRa to the first channel CH1 and may control the selected one from among the non-volatile memory devices NVM11 to NVM1n.

The respective non-volatile memory devices NVM11 to NVMmn may be operated by control of the memory controller 200. For example, the non-volatile memory device NVM11 may program the data DATAa according to the command CMDa, the address ADDRa, and the data DATAa provided to the first channel CH1. For example, the non-volatile memory device NVM21 may read the data DATAb according to the command CMDb and the address ADDRb provided to the second channel CH2, and may transmit the read data DATAb to the memory controller 200.

FIG. 4 shows that the non-volatile memory 300 communicates with the memory controller 200 through m-numbered channels, and the non-volatile memory 300 includes n-numbered non-volatile memory devices corresponding to the respective channels. However, example embodiments are not limited thereto and the number of the channels and the number of the non-volatile memory devices connected to one channel may be variously modified.

Figure 5:
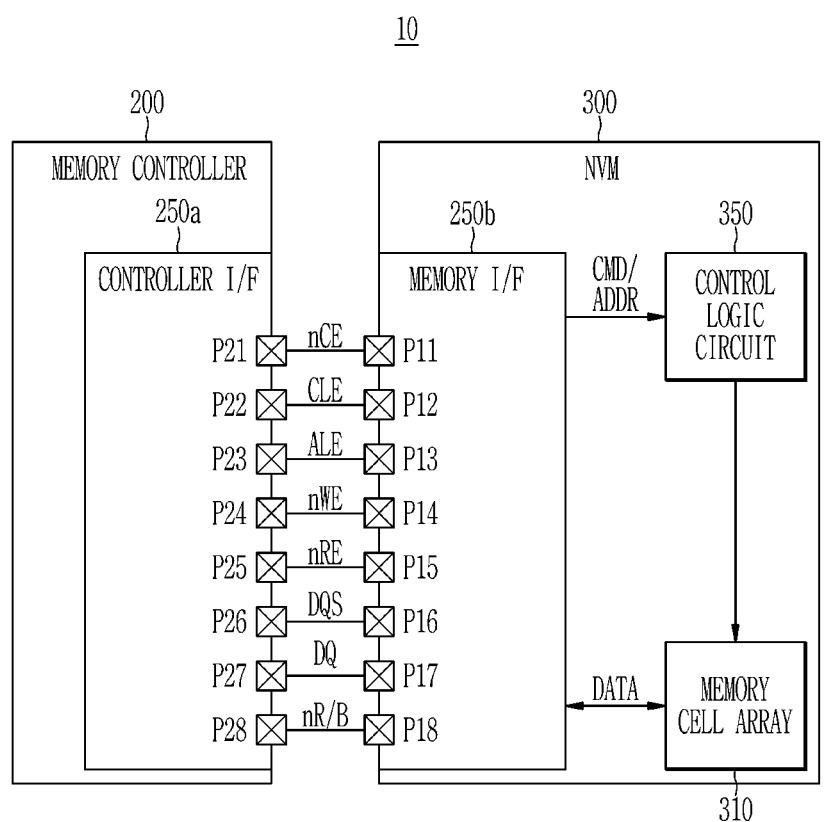
FIG. 5 shows a block diagram of a memory controller, a memory interface, and a non-volatile memory according to an example embodiment.

FIG. 5 shows a block diagram of a memory controller, a memory interface, and a non-volatile memory according to an example embodiment. The controller interface 250 of FIG. 2 may include a controller interface circuit 250a of FIG. 5.

The non-volatile memory 300 may include a plurality of pins P11 to P18, a memory interface circuit 250b, a control logic circuit 350, and a memory cell array 310. Here, the control logic circuit 350 and the memory cell array 310 may be equivalent to the control logic circuit 350 and the memory cell array 310 of FIG. 3. The memory controller 200 may include a plurality of pins P21 to P28 and a controller interface circuit 250a. The respective pins P21 to P28 may correspond to the pins P11 to P18 of the non-volatile memory 300.

The memory interface circuit 250b may receive a chip enable signal nCE from the memory controller 200 through the pin P11. The memory interface circuit 250b may transmit/receive signals to/from the memory controller 200 through the pins P12 to P18 according to the chip enable signal nCE. For example, when the chip enable signal nCE received through the pin P11 is in an enable state (e.g., a low level), the memory interface circuit 250b may transmit/receive corresponding signals to/from the memory controller 200 through the pins P12 to P18.

The memory interface circuit 250b may receive a command latch enable signal CLE, an address latch enable signal ALE, and a write enable signal nWE from the memory controller 200 through each of a plurality of pins P12 to P14. The memory interface circuit 250b may receive a data signal DQ from the memory controller 200 through the pin P17 and may transmit the data signal DQ to the memory controller 200. The command CMD, the address ADDR, and the data DATA may be transmitted by use of the data signal DQ. For example, the data signal DQ may be transmitted through a plurality of data signal lines. In this case, although one pin P17 is shown in FIG. 5, example embodiments are not limited thereto and the pin P17 may include a plurality of pins respectively corresponding to paths for transmitting/receiving a plurality of data signals.

The memory interface circuit 250b may obtain the command CMD from the data signal DQ received in an enable section (e.g., a high level state) of a command latch enable signal CLE based on toggle timings of a write enable signal nWE. The memory interface circuit 250b may obtain the address ADDR from the data signal DQ received in the enable section (e.g., the high level state) of the address latch enable signal ALE based on the toggle timings of the write enable signal nWE. For example, the write enable signal new may maintain a static state (e.g., a high level or a low level) and may be toggled between the high level and the low level. The write enable signal nWE may be toggled for a section in which the command CMD or the address ADDR is transmitted. Accordingly, the memory interface circuit 250b may obtain the command CMD or the address ADDR from the data signal DQ based on the toggle timings of the write enable signal nWE.

The memory interface circuit 250b may receive a read enable signal nRE from the memory controller 200 through the pin P15. The memory interface circuit 250b may receive a data strobe signal DQS from the memory controller 200 through the pin P16, and may transmit the data strobe signal DQS to the memory controller 200 through the pin P16.

Regarding a data DATA output operation of the non-volatile memory 300, the memory interface circuit 250b may receive a read enable signal nRE that toggles through the pin P15 before outputting the data DATA. The memory interface circuit 250b may generate the data strobe signal DQS that toggles based on the toggling of the read enable signal nRE. For example, the memory interface circuit 250b may generate the data strobe signal DQS that starts toggling after a predetermined delay (e.g., tDQSRE) with respect to a toggling start time of the read enable signal nRE. The memory interface circuit 250b may be synchronized with the toggling timing of the data strobe signal DQS and may transmit the data signal DQ including data DATA. Accordingly, the data DATA may be synchronized with the toggling timing of the data strobe signal DQS, may be arranged, and may be transmitted to the memory controller 200.

Regarding the data DATA inputting operation of the non-volatile memory 300, when receiving the data signal DQ including data DATA from the memory controller 200, the memory interface circuit 250b may receive the data strobe signal DQS that toggles together with the data DATA from the memory controller 200. The memory interface circuit 250b may be synchronized with the toggle timing of the data strobe signal DQS and may obtain the data DATA from the data signal DQ. For example, the memory interface circuit 250b may obtain the data DATA by sampling the data signal DQ on at least one of a rising edge and a falling edge of the data strobe signal DQS.

The memory interface circuit 250b may transmit a ready/busy output signal nR/B to the memory controller 200 through the pin P18. The memory interface circuit 250b may transmit state information of the non-volatile memory 300 to the memory controller 200 through the ready/busy output signal nR/B. When the non-volatile memory 300 is in the busy state (i.e., when internal operations of the non-volatile memory 300 are performed), the memory interface circuit 250b may transmit the ready/busy output signal nR/B indicating the busy state to the memory controller 200. When the non-volatile memory 300 is in the ready state (i.e., when the internal operations of the non-volatile memory 300 are not performed or have been completed), the memory interface circuit 250b may transmit the ready/busy output signal nR/B indicating the ready state to the memory controller 200.

For example, while the non-volatile memory 300 reads the data DATA from the memory cell array 310 in response to a page read command, the memory interface circuit 250b may transmit the ready/busy output signal nR/B indicating the busy state (e.g., low level) to the memory controller 200. For example, while the non-volatile memory 300 programs the data DATA to the memory cell array 310 in response to a program command, the memory interface circuit 250b may transmit the ready/busy output signal nR/B indicating the busy state to the memory controller 200.

The control logic circuit 350 may generally control various operations of the non-volatile memory 300. The control logic circuit 350 may receive the obtained command/address CMD/ADDR from the memory interface circuit 250b. The control logic circuit 350 may generate control signals for controlling other constituent elements of the non-volatile memory 300 according to the received command/address CMD/ADDR. For example, the control logic circuit 350 may generate control signals for programming the data DATA to the memory cell array 310 according to the address that corresponds to the data DATA, or reading the data DATA from the memory cell array 310 according to the address.

The memory cell array 310 may store the data DATA obtained from the memory interface circuit 250b according to control by the control logic circuit 350. The memory cell array 310 may output the stored data DATA to the memory interface circuit 250b according to control by the control logic circuit 350.

The memory cell array 310 may include a plurality of memory cells. For example, the memory cells may be flash memory cells. However, the present disclosure is not limited thereto, and the memory cells may be a Resistive Random Access Memory (RRAM) cell, a Ferroelectric Random Access Memory (FRAM) cell, a Phase Change Random Access Memory (PRAM) cell, a Thyristor Random Access Memory (TRAM) cell, and a Magnetic Random Access Memory (MRAM) cell. Hereinafter, example embodiments will be described with a focus on an example in which the memory cells are NAND flash memory cells.

The controller interface circuit 250a may transmit a chip enable signal nCE to the non-volatile memory 300 through the pin P21. The controller interface circuit 250a may transmit/receive signals to/from the non-volatile memory 300 selected according to the chip enable signal nCE through the pins P22 to P28.

The controller interface circuit 250a may transmit a command latch enable signal CLE, an address latch enable signal ALE, and a write enable signal to the non-volatile memory 300 through the pins P22 to P24. The controller interface circuit 250a may transmit the data signal DQ to the non-volatile memory 300 through the pin P27, and may receive the data signal DQ from the non-volatile memory 300.

The controller interface circuit 250a may transmit the data signal DQ including the command CMD or the address ADDR to the non-volatile memory 300 together with the write enable signal nWE that toggles. The controller interface circuit 250a may transmit the data signal DQ including the command CMD to the non-volatile memory 300 for a section while the command latch enable signal CLE is in an enable state, and may transmit the data signal DQ including the address ADDR to the non-volatile memory 300 for a section while the address latch enable signal ALE in an enable state.

The controller interface circuit 250a may transmit the read enable signal nRE to the non-volatile memory 300 through the pin P25. The controller interface circuit 250a may receive the data strobe signal DQS from the non-volatile memory 300 through the pin P26, and may transmit the data strobe signal DQS to the non-volatile memory 300.

Regarding the data DATA outputting operation of the non-volatile memory 300, the controller interface circuit 250a may generate a read enable signal nRE that toggles, and may transmit the read enable signal nRE to the non-volatile memory 300. For example, the controller interface circuit 250a may generate a read enable signal nRE that is changed to a toggling state from a static state (e.g., high level or low level) before the data DATA are output. Hence, the non-volatile memory 300 may generate the data strobe signal DQS that toggles based on the read enable signal nRE. The controller interface circuit 250a may receive the data signal DQ including the data DATA together with the data strobe signal DQS that toggles from the non-volatile memory 300. The controller interface circuit 250a may obtain the data DATA from the data signal DQ based on the toggle timing of the data strobe signal DQS.

Regarding the data DATA inputting operation of the non-volatile memory 300, the controller interface circuit 250a may generate the data strobe signal DQS that toggles. For example, the controller interface circuit 250a may generate the data strobe signal DQS that is changed to the toggling state from the static state (e.g., high level or low level) before transmitting the data DATA. The controller interface circuit 250a may be synchronized with the toggle timings of the data strobe signal DQS data DATA and may transmit the data signal DQ to the non-volatile memory 300.

The controller interface circuit 250a may receive the ready/busy output signal nR/B from the non-volatile memory 300 through the pin P28. The controller interface circuit 250a may distinguish state information of the non-volatile memory 300 based on the ready/busy output signal nR/B.

Figure 6:
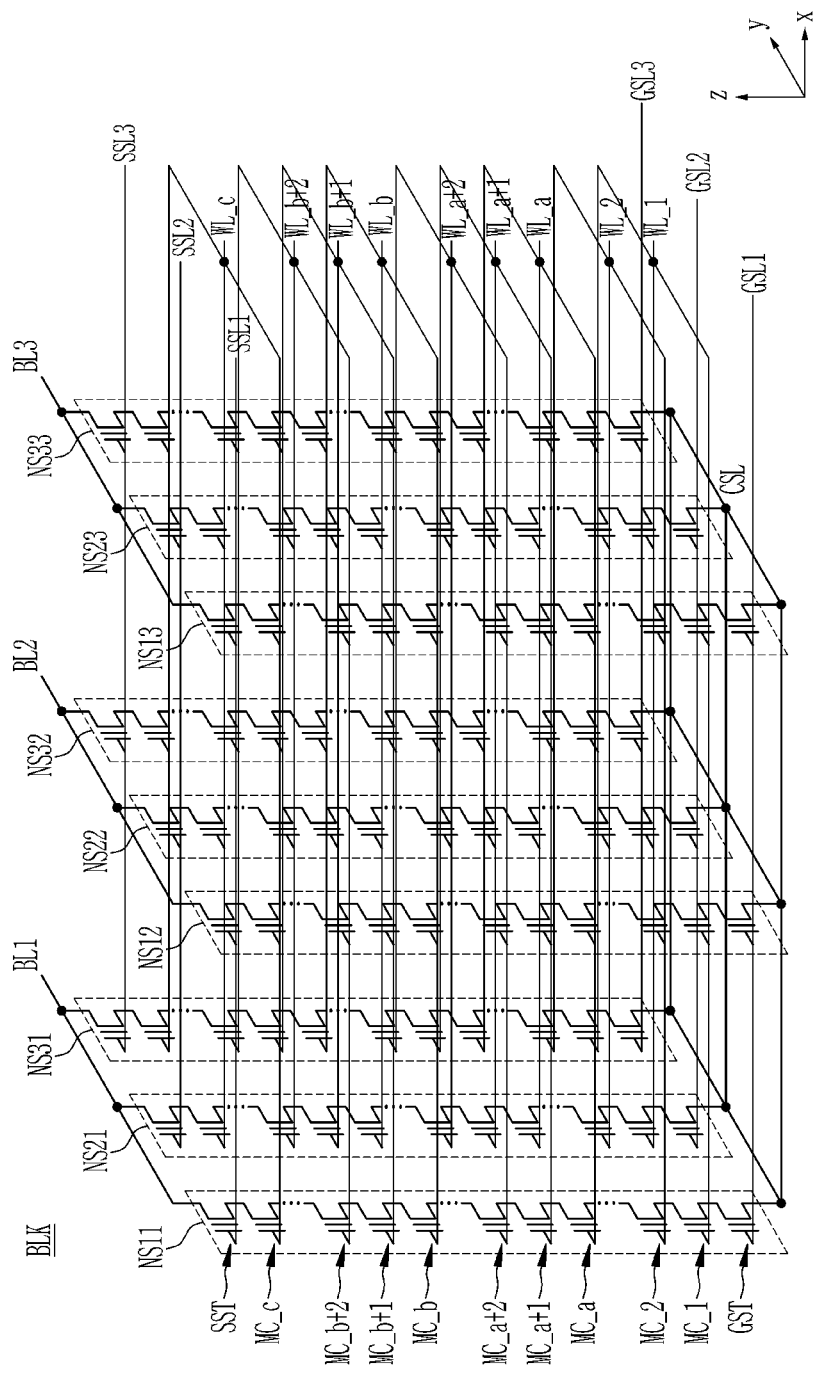
FIG. 6 shows a circuit diagram of a memory cell array according to an example embodiment.

FIG. 6 shows a circuit diagram of a memory cell array according to an example embodiment.

As shown in FIG. 6, a circuit diagram of one block BLK of a plurality of blocks included by the non-volatile memory 300 is given. The circuit diagram shown in FIG. 6 is an example for describing an example embodiment, and the present disclosure is not limited thereto. For example, although FIG. 6 shows three bit lines BL1 to BL3, example embodiments are not limited thereto and the number of the bit lines connected to the block BLK may be four or more.

A plurality of cell strings NS11, NS21, NS31, NS12, NS22, NS32, NS13, NS23, and NS33 may be disposed in a first direction (BL elongation direction or y-axis direction) and a second direction (WL elongation direction or x-axis direction). The memory cells of the respective cell strings NS11, NS21, NS31, NS12, NS22, NS32, NS13, NS23, and NS33 may extend in a third direction (z-axis direction) that is perpendicular to the first and second directions. The cell strings NS11, NS21, NS31, NS12, NS22, NS32, NS13, NS23, and NS33 may be connected in common to a common source line CSL. The common source line CSL is shown to be connected to lowest ends of the cell strings NS11, NS21, NS31, NS12, NS22, NS32, NS13, NS23, and NS33 in the third direction, it may be sufficient for the common source line CSL to be electrically connected to the lowest ends of the cell strings NS11, NS21, NS31, NS12, NS22, NS32, NS13, NS23, and NS33 in the third direction (z), and the common source line CSL is not limited to be physically disposed at the lower ends of the cell strings NS11, NS21, NS31, NS12, NS22, NS32, NS13, NS23, and NS33. Further, the cell strings NS11, NS21, NS31, NS12, NS22, NS32, NS13, NS23, and NS33 are shown to be disposed in an arrangement of 3×3 in FIG. 6, and the disposition and the number of the cell strings disposed in the memory cell array 310 are not limited thereto.

The cell strings NS11, NS12, and NS13 may be connected to a ground select line GSL1 and a string select line SSL1, the cell strings NS21, NS22, and NS23 may be connected to a ground select line GSL2 and a string select line SSL2, and the cell string NS31, NS32, and NS33 may be connected to a ground select line GSL3 and a string select line SSL3. The respective cell strings NS11, NS21, NS31, NS12, NS22, NS32, NS13, NS23, and NS33 may include a string select transistor SST including a gate connected to the corresponding string select line and a ground select transistor GST including a gate connected to the corresponding ground select line.

One ends of the corresponding ground select transistors GST of the cell strings NS11, NS21, NS31, NS12, NS22, NS32, NS13, NS23, and NS33 may be connected to the common source line CSL, and one of ends of the corresponding string select transistors SST of the cell strings NS11, NS21, NS31, NS12, NS22, NS32, NS13, NS23, and NS33 may be connected to the corresponding one of the bit lines BL1, BL2, and BL3. The respective cell strings NS11, NS21, NS31, NS12, NS22, NS32, NS13, NS23, and NS33 may include memory cell (e.g., MC_1 to MC_c, here c is an integer of equal to or greater than 2) sequentially stacked in a third direction between the ground select transistor and the string select transistor and connected to each other.

Regarding the memory cells MC_1 to MC_c, the memory cells disposed at a same height from an arbitrary reference in the third direction may be connected to the same word line. For example, the memory cells connected to the word lines WL_1 to WL_c may be disposed at the same height from the ground select transistor GST.

The memory cells corresponding to a string (or ground) select line and a word line may form a page. The write operation and the read operation may be performed per page. The respective memory cells of the respective pages may store two or more bits. The bits written to the memory cells of the respective pages may form logic pages.

Further, one block BLK may include a first sub-block S_BLK1 including word lines WL1 to WL_a (here, a is an integer of equal to or greater than 2) from among the word lines WL_1 to WL_c, a second sub-block S_BLK2 including word lines WL_a+1 to WL_b (here, integers satisfy a<b<c) from among the word lines WL_1 to WL_c, and a third sub-block S_BLK3 including word lines WL_b+1 to WL_c from among the word lines WL_1 to WL_c. FIG. 6 shows that the block includes three sub-blocks, and the number of the sub-blocks is not limited thereto. However, example embodiments are not limited thereto and the number of the sub-blocks may be two or more.

The memory cell array 310 may be provided as a three-dimensional (3D) memory array. Layers of respective levels of the 3D array may be deposited on the layers of the lower level of the 3D array. A plurality of sub-blocks may be disposed to be perpendicular to the substrate of the memory cell array 310 in one block. One block may include a plurality of sub-blocks in a multi-stack structure, and a physical distance between adjacent sub-blocks from among the sub-blocks may be equal to or greater than a predetermined value. When the distance between the adjacent word lines is short, a memory operation (program, erase, etc.,) executed through a certain word line may give an influence (hereinafter, interference) to another word line that is near the certain word line. The distance between the adjacent sub-blocks may be equal to or greater than a distance that blocks the interference among the respective sub-blocks. Accordingly, the erase operation may be executed per sub-block. An order for programming the sub-blocks configuring the block must be sequential in a predetermined direction. For example, in the present disclosure, when the sub-blocks are stacked in a direction perpendicular with respect to the substrate, the programming may be performed in order from the block (hereinafter, lower block) disposed near the substrate to the block (upper block) disposed distant from the substrate. In another way, the programming may be executed in order from the upper block to the lower block. The present disclosure may not be limited to the specific direction, and the programming direction may be set in many ways according to the design.

Figure 7:
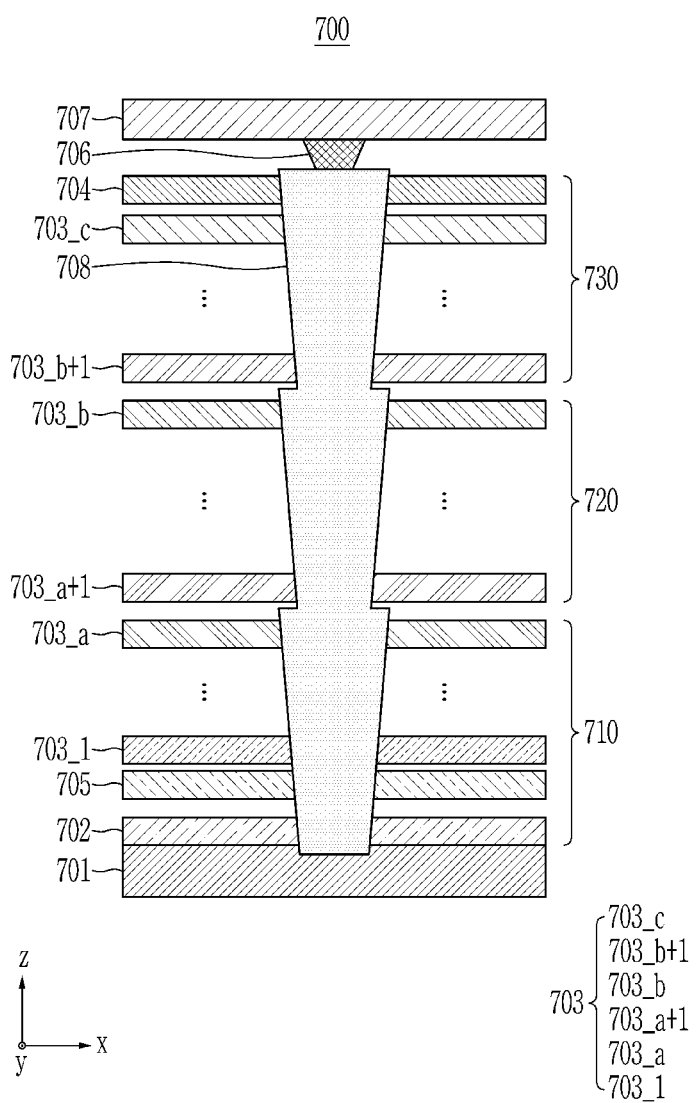
FIG. 7 shows a cross-sectional view of part of a block according to an example embodiment.

FIG. 7 shows a cross-sectional view of part of a block according to an example embodiment.

FIG. 7 shows a predetermined region of the block 700 with reference to a channel structure body 708 connected to a bit line 707. The block 700 has a multi-stack structure and a plurality of sub-blocks 710, 720, and 730. The three sub-blocks 710, 720, and 730 are an example of the multi-stack structure, and the present disclosure is not limited to the structure shown in FIG. 7.

The block 700 may include a substrate 701, a common source line 702, word lines 703 of 703_1 to 703_c, a string select line 704, a ground select line 705, a metal wire 706, a bit line 707, and a channel structure body 708.

The common source line 702, the ground select line 705, the word lines 703, and the string select line 704 may be stacked on the substrate 701 in the direction (z-axis direction) that is perpendicular to an upper side of the substrate 701. The string select line 704 and the ground select line 705 may be disposed on upper portions and lower portions of the word lines 703, and the word lines 703 may be disposed between the string select line and the ground select line 705.

The channel structure body 708 may extend to be perpendicular to the upper side of the substrate 701 and may penetrate the word lines 703, the string select line 704, the ground select line 705, and the common source line 702. The metal wire 706 is stacked on the upper side of the channel structure body 708, and the bit line 707 is stacked on the metal wire 706. The channel structure body 708 may include a data storage layer, a channel layer, and a fill insulation layer. Although FIG. 7 shows that a width of a cross-section of the channel structure body 708 is reduced while going downward with respect to the third direction in the sub-blocks 710, 720, and 730, the present disclosure is not limited thereto. For example, the channel structure body 708 may have a shape defined by a curved line or a straight line that continues to a lowermost portion from an uppermost portion. The word lines 703, the string select line 704, and the ground select line 705 may extend in a second direction (x-axis direction) that is parallel to the upper side of the substrate 701.

As shown in FIG. 7, in a spatial way in the block 700, the sub-block 710 may correspond to the region from the common source line 702 to the word line 703_$a$, the sub-block 720 may correspond to the region from the word line 703_$a$+1 to the word line 703_$b$, and the sub-block 730 may correspond to the region from the word line 703_$b$+1 to the string select line 704. The sub-block 710 may include word lines 703_1 to 703_$a$, the sub-block 720 may include word lines 703_$a$+1 to 703_$b$, and the sub-block 730 may include word lines 703_$b$+1 to 703_$c$.

Regarding the non-volatile memory 300 in a multi-stack structure, there may be limits in a programming order of the sub-blocks. For example, when the non-volatile memory 300 has a multi-stack structure, if there is a lower sub-block between a sub-block to be programmed and the substrate 701, the sub-block may be programmed only when the lower sub-block is in a valid state. In this regard, when the sub-block 710 shown in FIG. 7 is in a valid state, the sub-block 720 that is a higher (e.g., farther away from the substrate 701) block of the sub-block 710 may be programmed. Further, when the sub-block 720 is in a valid state, the sub-block 730 that is a higher block of the sub-block 720 may be programmed. Example embodiments are not required to have any restrictions on programming the word lines and erasing the sub-blocks, but example embodiments have the above-noted restriction on programming the sub-blocks. Due to this restrictions, imbalance of erase count values among the sub-blocks may be generated. It will be described hereinafter that the first sub-block is disposed at the bottom of the multi-stack structure (i.e., closest to the substrate 701), the second sub-block is disposed on the first sub-block, and the third sub-block is disposed on the second sub-block.

The memory controller 200 may classify blocks including sub-blocks that may be programmed from among all blocks into a usable block pool, and may manage the blocks included in the usable block pool to be programmed by using EC values for respective sub-blocks. The memory controller 200 may classify the blocks that may not be programmed from among all blocks into a victim block pool, and may manage the victim block pool by using the EC values for respective sub-blocks. Further, the memory controller 200 may classify the blocks of which the difference of the EC values among the sub-blocks, that is, the EC gap is greater than a predetermined threshold value from among the blocks belonging to the usable block pool into a wear leveling block pool, and may manage the wear leveling block pool by using the EC values for respective sub-blocks. For example, the memory controller 200 may classify the blocks in which the difference of the EC values among the sub-blocks of the blocks belonging to the usable block pool is greater than a threshold value into a wear leveling block pool, and may control the wear leveling on the sub-blocks of the respective blocks according to the difference of EC values in the respective blocks. The flash transition layer FTL 225 of the memory controller 200 may obtain a programmable block from the usable block pool when there is a data write request from a host, a data write request for garbage collection, or a data write request for wear leveling. That is, the flash transition layer FTL 225 may determine an address (or a number) of the block to which data will be written and a page address (or a number) at the corresponding block. The respective blocks may include sub-blocks, and the respective sub-blocks include pages so when the pages are specified, the sub-block at the corresponding block may also be specified. The flash transition layer FTL 225 may obtain the block for performing garbage collection in the victim block pool. The flash transition layer FTL 225 may perform wear leveling on a predetermined block of the wear leveling block pool for respective sub-blocks and may move the corresponding block to the usable block pool. The wear leveling may include an operation for duplicating data of a predetermined sub-block of the wear leveling block pool to a sub-block of another block (e.g., a block of the usable block pool), and erasing a predetermined sub-block of the wear leveling block pool.

Figure 8:
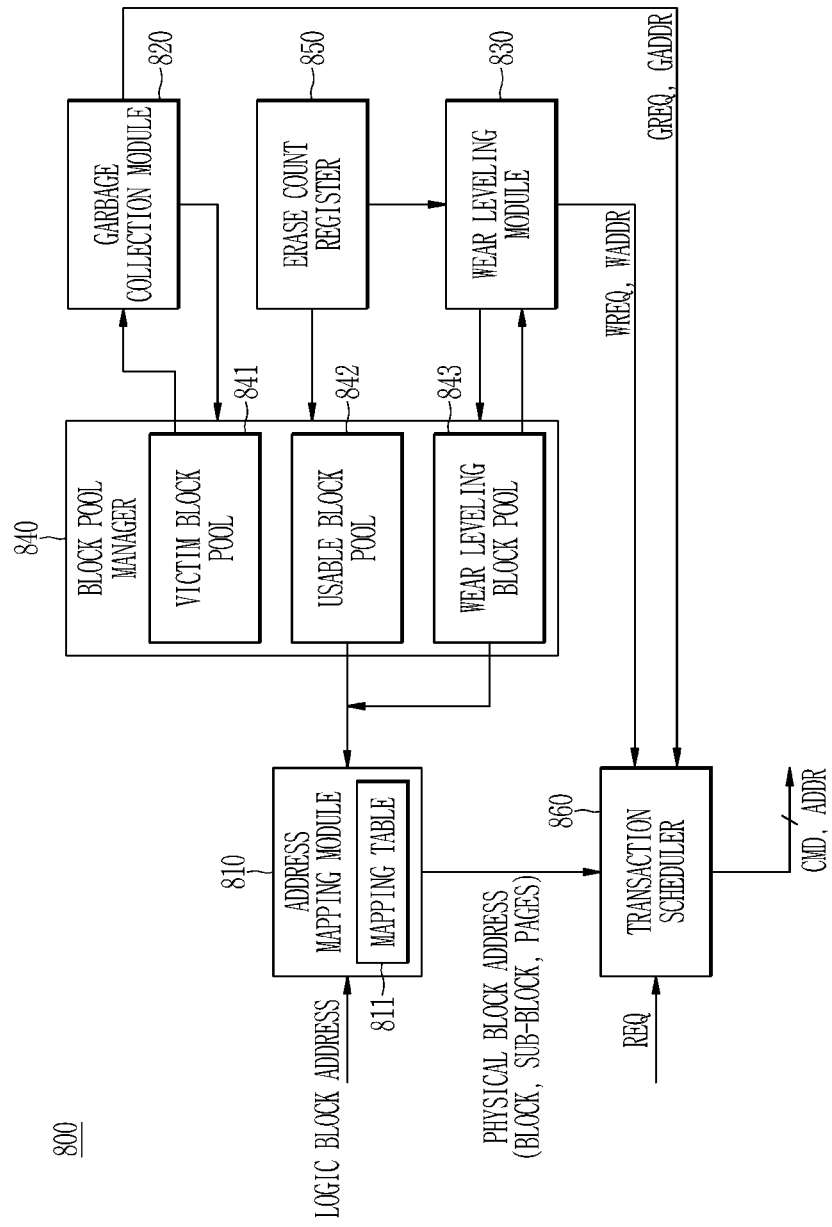
FIG. 8 shows a block diagram of an FTL according to an example embodiment.

FIG. 8 shows a block diagram of a flash transition layer FTL according to an example embodiment.

The flash transition layer FTL 800 includes some constitutional elements of the flash transition layer FTL 225 shown in FIG. 2.

The flash transition layer FTL 800 may include an address mapping module 810, a garbage collection module 820, a wear leveling module 830, a block pool manager 840, an erase count register 850, and a transaction scheduler 860.

The address mapping module 810 may determine a physical block address that corresponds to a logic block address that corresponds to a request REQ. For example, the address mapping module 810 may allocate a predetermined one of the blocks belonging to the usable block pool 842 as a data writing block corresponding to a data write request, and may map the logic block address on the data to be written and the physical address of the allocated block. The address mapping module 810 may include an address mapping table 811 for mapping logic block addresses and physical block addresses corresponding to the same. The address mapping module 810 may provide physical addresses to the control logic circuit 350 of the non-volatile memory 300. The physical block address may include addresses for indicating blocks, sub-blocks, and pages of the corresponding blocks. The transaction scheduler 860 may generate commands CMD and addresses ADDR according to requests REQ and physical block addresses, and may provide the same to the non-volatile memory 300.

The garbage collection module 820 may duplicate valid data of a predetermined sub-block from among the blocks belonging to the victim block pool 841 to a sub-block of a predetermined block of the usable block pool 842, may erase the predetermined sub-block, and may resultantly obtain capacity usable in the non-volatile memory 300. The garbage collection module 820 may generate a request GREQ for garbage collection and an address GADDR for the sub-block to be duplicated, and may provide the same to the transaction scheduler 860. The transaction scheduler 860 may generate a command CMD for reading data of the sub-block that corresponds to the address GADDR and writing the data to another block according to the request GREQ, and may provide the generated command CMD and the address GADDR to the non-volatile memory 300. The garbage collection module 820 may perform garbage collection on the block belonging to the victim block pool 841, and may provide information on the corresponding block to the block pool manager 840. The block pool manager 840 may move the corresponding block to the usable block pool 842 from the victim block pool 841.

The wear leveling module 830 may perform a sub-block-based data duplicate and erase operation on a predetermined block (hereinafter, wear leveling target block) of the wear leveling block pool 843 and may convert the wear leveling target block into a usable block. In this instance, the wear leveling module 830 may perform wear leveling on the block of which the EC value is small and the EC gap among the sub-blocks is large. The wear leveling module 830 may generate a wear leveling request WREQ on the wear leveling target block and an address WADDR on the wear leveling target block and may provide the same to the transaction scheduler 860. The transaction scheduler 860 may generate a command CMD for reading data of the sub-block that corresponds to the address WADDR and writing the same to another block according to the request GREQ, and may provide the generated command CMD and the address WADDR to the non-volatile memory 300. The wear leveling module 830 may, when the EC gap of a predetermined block becomes less than a threshold value through a wear leveling, provide information on the corresponding block to the block pool manager 840. The block pool manager 840 may move the corresponding block to the usable block pool 842 from the wear leveling block pool 843.

The erase count register 850 may store the EC values of the respective sub-blocks in the respective blocks configuring the non-volatile memory 300. The flash transition layer FTL 800 may update the erase count register 850 with the EC value of the corresponding sub-block after erasing the data on the sub-block.

The block pool manager 840 may configure the victim block pool 841, the usable block pool 842, and the wear leveling block pool 843 based on the states and the EC gaps of the sub-blocks of the blocks configuring the non-volatile memory 300. The block pool manager 840 is shown in FIG. 8 to include the victim block pool 841, the usable block pool 842, and the wear leveling block pool 843. However, the present disclosure is not limited thereto. For example, at least one of the victim block pool 841, the usable block pool 842, and the wear leveling block pool 843 may be separated from the block pool manager 840. The block pool manager 840 may classify the programmable block into the usable block pool 842, and may, when the EC gap among the sub-blocks in the corresponding block is greater than a predetermined threshold value, classify the corresponding block into the wear leveling block pool 843.

The victim block pool 841, the usable block pool 842, and the wear leveling block pool 843 may each include a block list configured with addresses (or numbers) on the blocks belonging to the respective block pools. The block pool manager 840 may match state information on the sub-blocks of a predetermined block for respective sub-blocks and may record the same in a list of the respective block pools. The block pool manager 840 may classify the blocks belonging to the corresponding block pool in the list of the respective block pools by types according to state information of the sub-blocks of the respective blocks. The block pool manager 840 may identify the EC values of the respective sub-blocks from the erase count register 850 and may classify the blocks of the respective types based on the EC values.

The transaction scheduler 860 may schedule a request from the host 100, a request GREQ from the garbage collection module 820, and a request WREQ from the wear leveling module 830 according to predetermined policies to generate commands CMD that correspond to the respective requests, and may provide the same together with the corresponding address ADDR to the non-volatile memory 300. Additionally, outputs of the transaction scheduler 860 may be transmitted to the non-volatile memory 300 through the controller interface 250.

The respective blocks will now be described to be configured with three sub-blocks stacked on the substrate of the non-volatile memory 300. However, the present disclosure is not limited thereto, and the respective blocks may include more than three sub-blocks.

Figure 9:
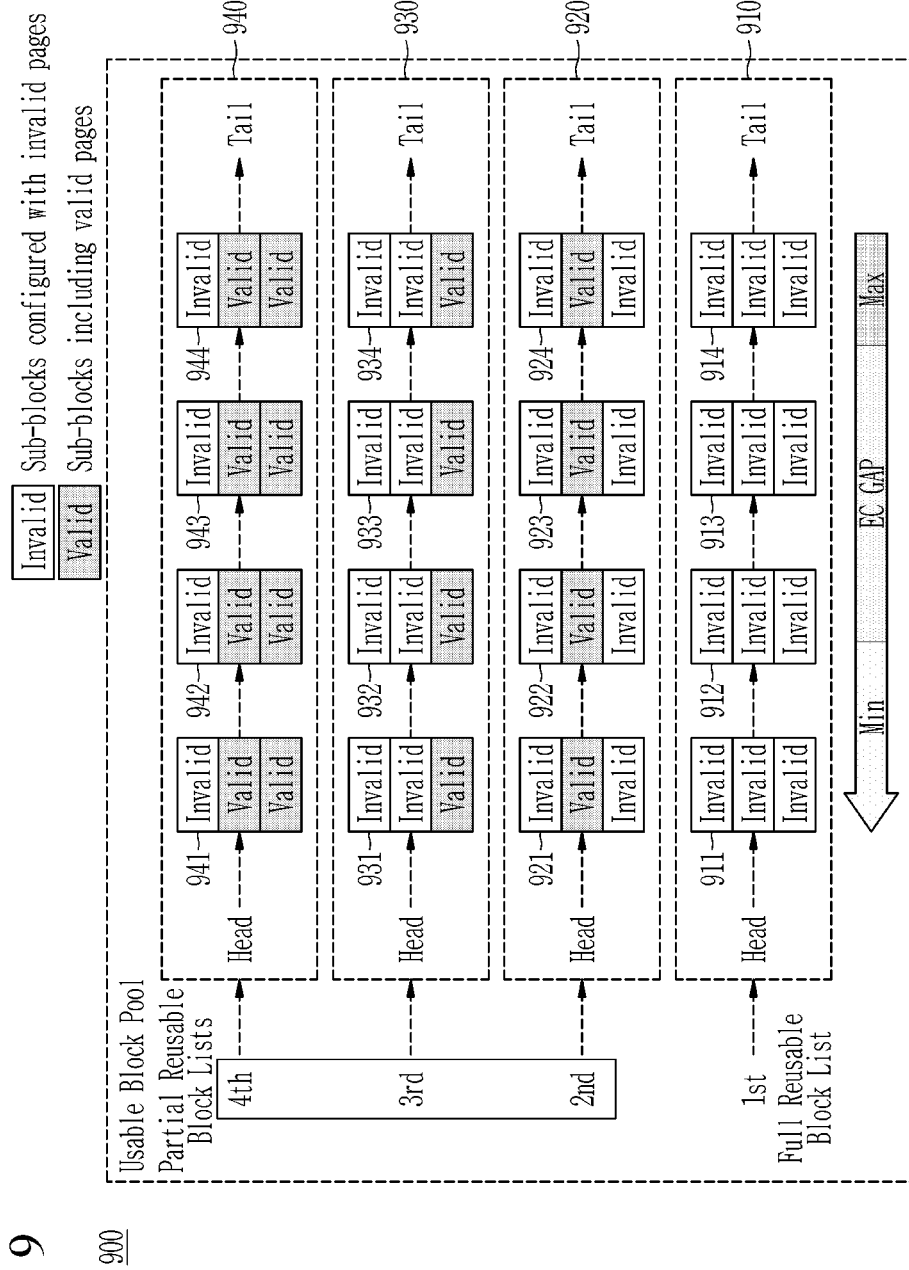
FIG. 9 shows a schematic diagram of a usable block pool according to an example embodiment.

FIG. 9 shows a schematic diagram of a usable block pool according to an example embodiment.

As shown in FIG. 9, the usable block pool 900 includes four block groups 910, 920, 930, and 940 respectively corresponding to four types. The number of types of block groups described with reference to FIG. 9 is provided as an example in consideration of the number (e.g., 3) of the sub-blocks and programming limit conditions, and the present disclosure is not limited thereto. The first block group 910 may correspond to a list including fully reusable blocks, and the second block group to fourth block groups 920 to 940 may correspond to lists including partially reusable blocks. The block pool manager 840 may generate reusable block lists for respective types to configure the usable block pool 900, and may combine the blocks that correspond to the reusable block lists for respective types to generate the first to fourth block groups 910, 920, 930, and 940. The address mapping module 810 may allocate blocks to be programmed in order of the first block group 910, the second block group 920, the third block group 930, and the fourth block group 940.

The first block group 910 may include blocks 911 to 914 arranged from a head to a tail. The head and the tail may be reference positions for defining a direction in which the blocks are arranged in the respective block groups. The blocks 911 to 914 in the first block group 910 may be arranged based on the EC gap in the corresponding blocks. For example, the EC gap may be reduced as the arrangement positions of the blocks 911 to 914 go to the head from the tail. The EC gap may be one of the EC values among the sub-block in the block. For example, the EC gaps that are representative of the blocks may be a difference between the highest EC value and the lowest EC value from among the EC values of the sub-blocks of the respective blocks. The respective blocks 911 to 914 may include first, second and third sub-blocks in an invalid state. The sub-blocks in an invalid state include invalid pages. For example, the invalid pages may not store valid data. The flash transition layer FTL 800 may erase the sub-blocks in an invalid state of the respective blocks 911 to 914, may convert the same into programmable free sub-blocks, and may allocate the same as sub-blocks to be programmed. That is, the blocks 911 to 914 are reusable blocks, and the address mapping module 810 may allocate a predetermined sub-block of the first to third sub-blocks of the blocks 911 to 914 to the logic block that corresponds to a data write request according to predetermined allocation strategies, and may map an address of the predetermined sub-block on the logic block address. In this instance, the address mapping module 810 may allocate the blocks 911 to 914 starting with the block having a small EC gap for the programming operation, and may allocate the sub-blocks in order from the first sub-block to the third sub-block. The above-noted block allocation strategy may be applied to the first block group 910 and also to the second to fourth block groups 920 to 940.

The second block group 920 may include blocks 921 to 924 arranged from the head to the tail. The blocks 921 to 924 in the second block group 920 may be arranged based on the EC gap of the corresponding blocks. The EC gap may be reduced as the arranged positions of the blocks 921 to 924 go to the head from the tail. The respective blocks 921 to 924 may respectively include the first and third sub-blocks that are in an invalid state and the second sub-block that is in a valid state. The sub-block in a valid state may include a valid page. For example, the valid pages may store valid data. As the second sub-block is in a valid state in the respective blocks 921 to 924, the third sub-block is programmable. The flash transition layer FTL 800 may erase the third sub-block to convert the same into a programmable free sub-block, and may allocate it as a sub-block to be programmed. That is, regarding the blocks 921 to 924, the third sub-blocks are reusable sub-blocks, and the address mapping module 810 may, according to a data write request according to the predetermined allocation strategy, allocate a predetermined sub-block from among the third sub-blocks of the blocks 921 to 924 to the logic block that corresponds to the data write request, and may map the address of the predetermined sub-block to the logic block address.

The third block group 930 may include blocks 931 to 934 arranged from the head to the tail. The arrangement reference of the blocks 931 to 934 in the third block group 930 follows the EC gap in the corresponding block. The EC gap may be reduced as the arrangement positions of the respective blocks 931 to 934 go to the head from the tail. The respective blocks 931 to 934 may respectively include the second and third sub-block in an invalid state and the first sub-block in a valid state. The first sub-blocks of the respective blocks 931 to 934 are in a valid state so the second sub-block and the third sub-block are in a programmable state. The flash transition layer FTL 800 may erase the second and third sub-blocks to convert them into programmable free sub-blocks and may allocate them as sub-blocks to be programmed. When the second sub-blocks of the respective blocks 931 to 934 come to be in a valid state by the program, the third sub-block comes to be in a programmable state. Therefore, the address mapping module 810 may, according to a data write request according to a predetermined allocation strategy, allocate a predetermined sub-block from among the second sub-block and the third sub-block of the blocks 931 to 934 to the logic block address that corresponds to the data write request, and may map the address of the predetermined sub-block to the logic block address. In this instance, the address mapping module 810 may allocate the sub-blocks in order of the second sub-block and the third sub-block.

The fourth block group 940 may include blocks 941 to 944 arranged from the head to the tail. The arrangement reference of the blocks 941 to 944 in the fourth block group 940 follows the EC gap in the corresponding block. The EC gap may be reduced as the arrangement positions of the blocks 941 to 944 go to the head from the tail. The respective blocks 941 to 944 may respectively include the third sub-block in an invalid state and the first sub-block and the second sub-block in a valid state. The second sub-blocks of the respective blocks 941 to 944 are in a valid state so the third sub-block is in a programmable state. The flash transition layer FTL 225 may erase the third sub-block to convert the same into a programmable free sub-block and may allocate it as a sub-block to be programmed. Therefore, the address mapping module 810 may, according to a data write request according to the predetermined allocation strategy, allocate the predetermined sub-block from among the third sub-blocks of the blocks 941 to 944 to the logic block address that corresponds to the data write request, and may map the address of the predetermined sub-block to the logic block address.

Figure 10:
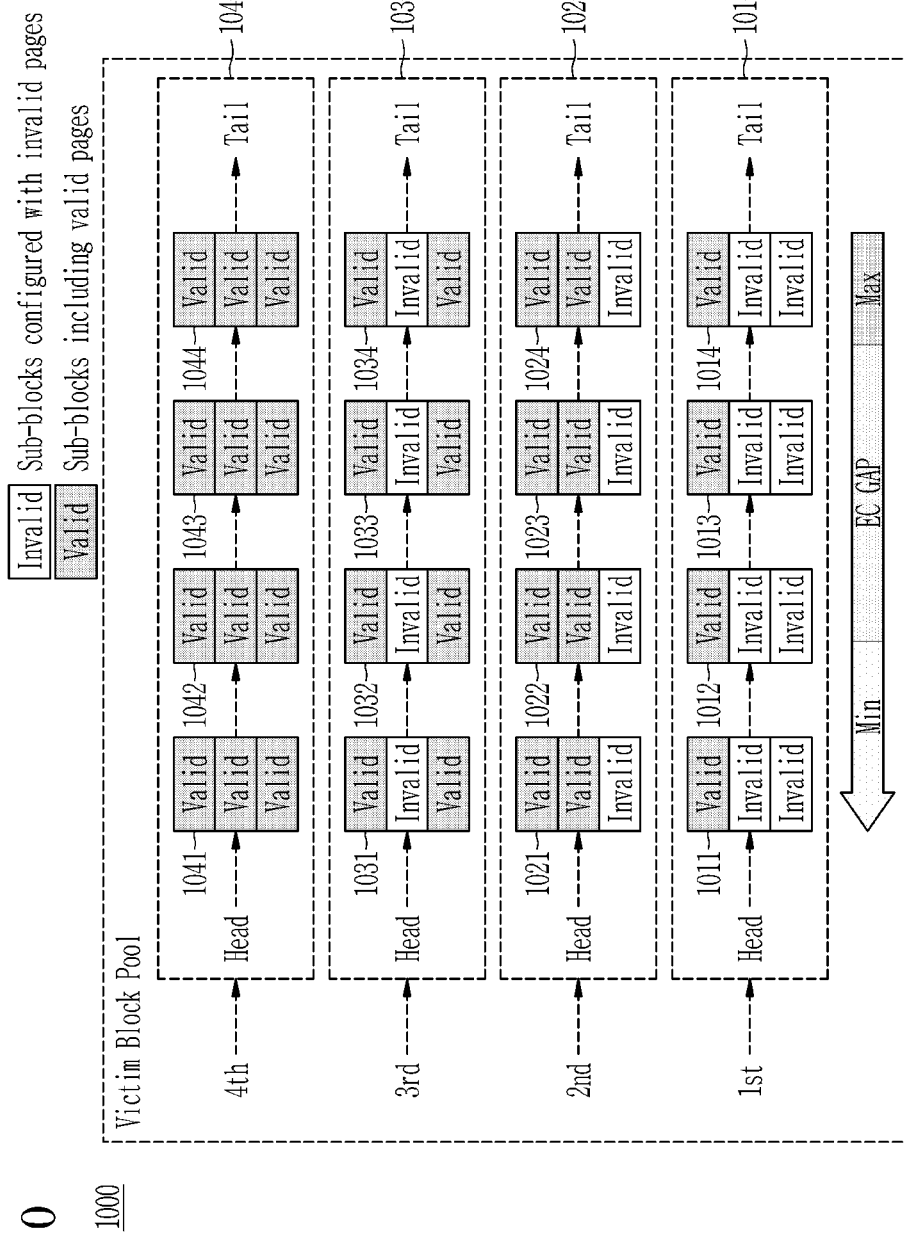
FIG. 10 shows a schematic diagram of a victim block pool according to an example embodiment.

FIG. 10 shows a schematic diagram of a victim block pool according to an example embodiment.

As shown in FIG. 10, the victim block pool 1000 includes four block groups 1010, 1020, 1030, and 1040. FIG. 10 is provided as an example in consideration of the number (i.e., 3) of the sub-blocks and the program limit conditions, and the present disclosure is not limited thereto. The respective four block groups 1010, 1020, 1030, and 1040 may include blocks that may be targets of the garbage collection for respective types. When the garbage collection module 820 performs garbage collection, one of the first to fourth block groups 1010, 1020, 1030, and 1040 of the victim block pool 1000 may select the block. For example, the garbage collection module 820 may perform garbage collection in order of the first block group 1010, the second block group 1020, the third block group 1030, and the fourth block group 1040. The first block group 1010 to fourth block groups 1010 to 1040 may respectively correspond to the sacrificial block list for respective types. The block pool manager 840 may generate sacrificial block lists for respective types to configure a victim block pool 1000, and may combine the blocks that correspond to the sacrificial block lists for respective types to generate the first to fourth block groups 1010, 1020, 1030, and 1040.

The first block group 1010 may include blocks 1011 to 1014 arranged from the head to the tail. The blocks 1011 to 1014 in the first block group 1010 may be arranged based on the EC gap in the corresponding blocks. The EC gap may be reduced as the arrangement positions of the blocks 1011 to 1014 go from the tail to the head. The blocks 1011 to 1014 may respectively include the first sub-block and the second sub-block in an invalid state and the third sub-block in a valid state. The garbage collection module 820 may duplicate valid data of the third sub-blocks of the respective blocks 1011 to 1014 to sub-blocks of another block (e.g., a block belonging to the usable block pool), may erase the respective blocks, and may perform the respective blocks to free blocks to thus perform the garbage collection. The garbage collection module 820 may allocate the blocks 1011 to 1014 starting from the block having the small EC gap for the garbage collection. The above-noted block allocation method may be applied to the first block group 1010 and also to the second to fourth block groups 1020 to 1040.

The second block group 1020 may include blocks 1021 to 1024 arranged from the head to the tail. The blocks 1021 to 1024 in the second block group 1020 may be arranged based on the EC gap in the corresponding blocks. The EC gap may be reduced as the arrangement positions of the blocks 1021 to 1024 go from the tail to the head. The respective blocks 1021 to 1024 may include the first sub-block in an invalid state, and the second sub-block and the third sub-block in a valid state. The garbage collection module 820 may duplicate valid data of the second and third sub-blocks of the respective blocks 1021 to 1024 to sub-blocks of another block, may erase the blocks, and may convert the respective blocks to free block to thus perform the garbage collection.

The third block group 1030 may include blocks 1031 to 1034 arranged from the head to the tail. The blocks 1031 to 1034 in the third block group 1030 may be arranged based on the EC gap in the corresponding blocks. The EC gap may be reduced as the arrangement positions of the blocks 1031 to 1034 go from the tail to the head. The respective blocks 1031 to 1034 may include the second sub-block in an invalid state, and the first sub-block and the third sub-block in a valid state. The garbage collection module 820 may duplicate valid data of the first and third sub-blocks of the respective blocks 1031 to 1034 to the sub-blocks of another block, may erase the respective blocks, and may convert the respective blocks into free blocks to thus perform the garbage collection.

The fourth block group 1040 may include blocks 1041 to 1044 arranged from the head to the tail. The blocks 1041 to 1044 in the fourth block group 1040 may be arranged based on the EC gap in the corresponding blocks. The EC gap may be reduced as the arrangement positions of the blocks 1041 to 1044 go from the tail to the head. The respective blocks 1041 to 1044 may include all valid sub-blocks. For example, the first sub-block to the third sub-block may be in a valid state. The garbage collection module 820 may duplicate valid data of the first to third sub-blocks of the respective blocks 1041 to 1044 to the sub-blocks of another block, may erase the respective blocks, and may convert the respective blocks into free blocks to thus perform the garbage collection.

Figure 11:
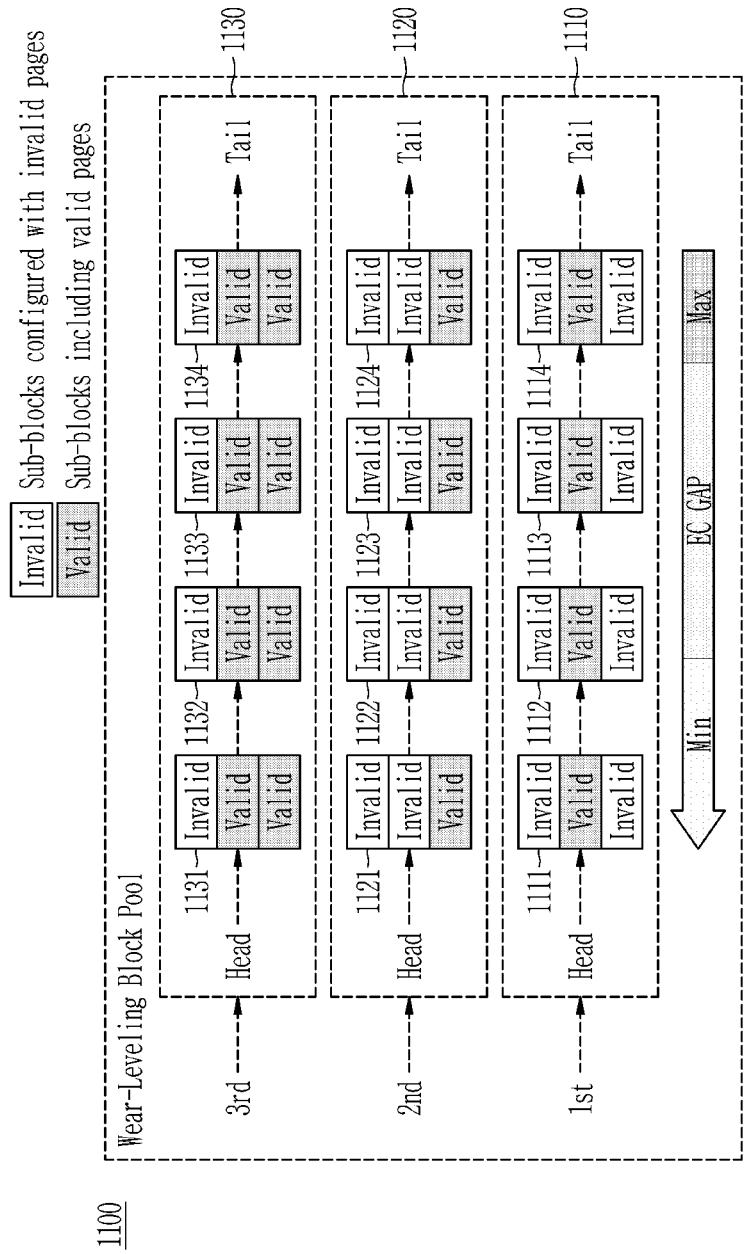
FIG. 11 shows a schematic diagram of a wear leveling block pool according to an example embodiment.

FIG. 11 shows a schematic diagram of a wear leveling block pool according to an example embodiment.

As shown in FIG. 11, the wear leveling block pool 1100 includes three block groups 1110, 1120, and 1130 respectively corresponding to three types of block groups. The number of types of block groups described with reference to FIG. 11 is provided in consideration of the number (e.g., 3) of the sub-blocks and programming limit conditions, and the present disclosure is not limited thereto.

The first block group 1110 may include blocks 1111 to 1114 arranged from the head to the tail. The blocks 1111 to 1114 in the first block group 1110 may be arranged based on the EC gap in the corresponding blocks. For example, the EC gap may be increased as the arrangement positions of the blocks 1111 to 1114 go from the tail to the head. The respective blocks 1111 to 1114 may include the first sub-block and the third sub-block in an invalid state and the second sub-block in a valid state. The wear leveling module 830 may duplicate data of the second sub-blocks of the respective blocks 1111 to 1114 to another block, may erase the first and second sub-blocks of the respective blocks 1111 to 1114, and may convert the same into programmable free sub-blocks. The address mapping module 810 may, according to a data write request according to predetermined allocation strategies, allocate a predetermined sub-block of the first sub-block and second sub-block of the blocks 1111 to 1114 to the logic block address that corresponds to the data write request and may map the address of the predetermined sub-block on the logic block address. The address mapping module 810 may allocate the first sub-blocks of the respective blocks 1111 to 1114, and may allocate the second sub-blocks of the respective blocks 1111 to 1114 under a condition in which the first sub-blocks are in a valid state. The address mapping module 810 may, as the EC gap of the respective blocks 1111 to 1114 increases, allocate the corresponding block in advance. The address mapping module 810 may, as the EC gap of the respective blocks 1111 to 1114 reduces, allocate the corresponding block in advance. For example, the block that has a smaller EC value between the two blocks of which a difference of the EC gaps therebetween is relatively small, from among the blocks 1111 to 1114, may be allocated in advance. The EC value of the block may be a sum of the EC values of the sub-blocks included by the block, may be the greatest value from among the EC values of the sub-blocks, or may be a value obtained by counting the number of erasures of the entire corresponding block. The EC value of the block is an example of a value for indicating an amount of usage of blocks, and the present disclosure is not limited thereto. When a priority for performing wear leveling increases as the EC value of the block is reduced, the EC values on the blocks that have small EC values increase while the EC values on the blocks that have large EC values, so the EC values of the entire blocks, that is, the use amount, may become equal.

The above-noted block allocation method may be applied to the first block group 1110 and also to the second to fourth block groups 1120 to 1140.

The second block group 1120 may include blocks 1121 to 1124 arranged from the head to the tail. The blocks 1121 to 1124 in the second block group 1120 may be arranged based on the EC gap in the corresponding blocks. For example, the EC gap may be increased as the arrangement positions of the blocks 1121 to 1124 go from the tail to the head. The respective blocks 1121 to 1124 may include the second sub-block and the third sub-block in an invalid state and the first sub-block in a valid state. The wear leveling module 830 may duplicate data of the first sub-blocks of the respective blocks 1121 to 1124 to another block, may erase the first sub-blocks of the respective blocks 1121 to 1124, and may convert the same into programmable free sub-blocks. The address mapping module 810 may, according to a data write request according to the predetermined allocation strategy, allocate the predetermined sub-block from among the first sub-blocks of the blocks 1121 to 1124 to the logic block address that corresponds to the data write request and may map the address of the predetermined sub-block to the logic block address. The third block group 1130 may include blocks 1131 to 1134 arranged from the head to the tail. The blocks 1131 to 1134 in the third block group 1130 may be arranged based on the EC gap in the corresponding blocks. For example, the EC gap may be increased as the arrangement positions of the blocks 1131 to 1134 go from the tail to the head. The respective blocks 1131 to 1134 may include the third sub-block in an invalid state and the first sub-block and the third sub-block in a valid state. The wear leveling module 830 may duplicate data of the second sub-blocks of the respective blocks 1131 to 1134 to another block, may erase at least second sub-blocks of the respective blocks 1131 to 1134, and may convert them into programmable free sub-blocks. The address mapping module 810 may, according to a data write request according to the predetermined allocation strategy, allocate a predetermined sub-block from among the second sub-blocks of the blocks 1131 to 1134 to the logic block address that corresponds to the data write request, and may map the address of the predetermined sub-block on the logic block address.

A method for configuring a wear leveling block pool according to an example embodiment will now be described with reference to FIG. 12 and FIG. 13.

A block pool manager 840 according to an example embodiment may detect the block that satisfies the wear leveling condition from among the entire blocks of the non-volatile memory 300 and may configure a wear leveling block pool.

Figure 12:
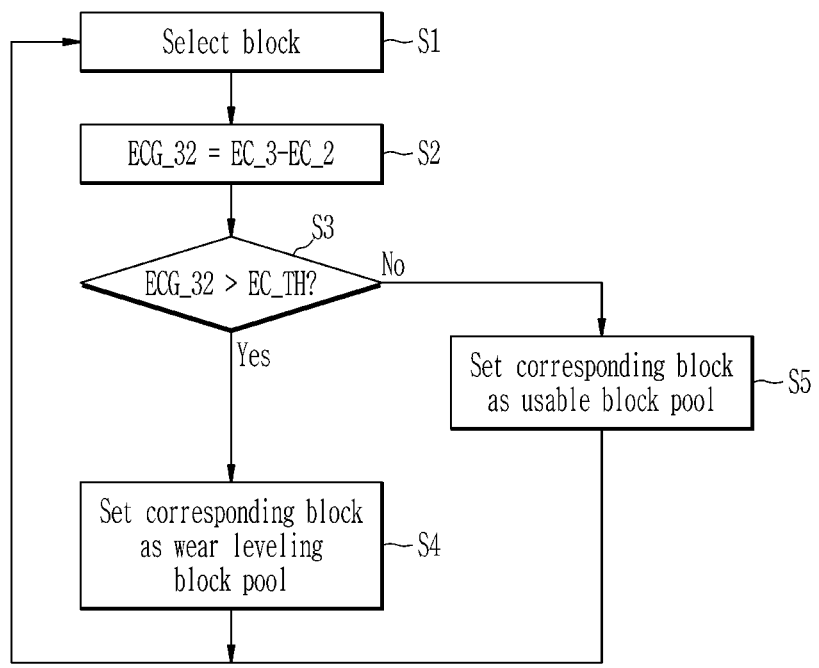
FIG. 12 shows a flowchart of a method for configuring a wear leveling block pool according to an example embodiment.

FIG. 12 shows a flowchart of a method for configuring a wear leveling block pool according to an example embodiment.

As shown in FIG. 12, the block pool manager 840 may select one of the entire blocks in operation S1. For example, in the blocks selected in operation S1, the first sub-block may be in an invalid state, the second sub-block may be in a valid state, and the third sub-block may be in an invalid state, or the first sub-block and the second sub-block may be in a valid state and the third sub-block may be in an invalid state.

The block pool manager 840 may, regarding the block selected in operation S1, calculate an EC gap ECG_32 that is a difference between the EC value EC_3 of the third sub-block and the EC value EC_2 of the second sub-block in operation S2. The block pool manager 840 may read the EC values of the sub-blocks of the block selected in operation S1 from the erase count register 850.

The block pool manager 840 may determine whether the EC gap ECG_32 is greater than a predetermined threshold value EC_TH in operation S3.

When the EC gap ECG_32 is greater than the threshold value EC_TH according to a determination result of operation S3, the block pool manager 840 may set the corresponding block to be a block that belongs to the wear leveling block pool 1100 in operation S4. In detail, the block pool manager 840 may set the corresponding block to be the block that belongs to the first block group 1110 of the wear leveling block pool 1100 when the first sub-block of the corresponding block is in an invalid state, the second sub-block is in a valid state, and the third sub-block is in an invalid state, and the block pool manager 840 may set the corresponding block to be the block that belongs to the third block group 1130 of the wear leveling block pool 1100 when the first sub-block and the second sub-block of the corresponding block are in a valid state and the third sub-block is in an invalid state.

When the EC gap ECG_32 is equal to or less than the threshold value EC_TH according to the determination result of operation S3, the block pool manager 840 may set the corresponding block to be a block that belongs to the usable block pool 900 in operation S5. In detail, the block pool manager 840 may set the corresponding block to be a block that belongs to the second block group 920 in the usable block pool 900 when the first sub-block of the corresponding block is in an invalid state, the second sub-block is in a valid state, and the third sub-block is in an invalid state, and the block pool manager 840 may set the corresponding block to be a block that belongs to the fourth block group 940 in the wear leveling block pool 1100 when the first sub-block and the second sub-block of the corresponding block are in a valid state and the third sub-block is in an invalid state.

The above-noted operations S1 to S5 may be applied to the blocks in the same type from among all blocks. The same type may include a case in which the first sub-block is in an invalid state, the second sub-block is in a valid state, and the third sub-block is in an invalid state, and a case in which the first sub-block and the second sub-block are in a valid state and the third sub-block is in an invalid state.

Figure 13:
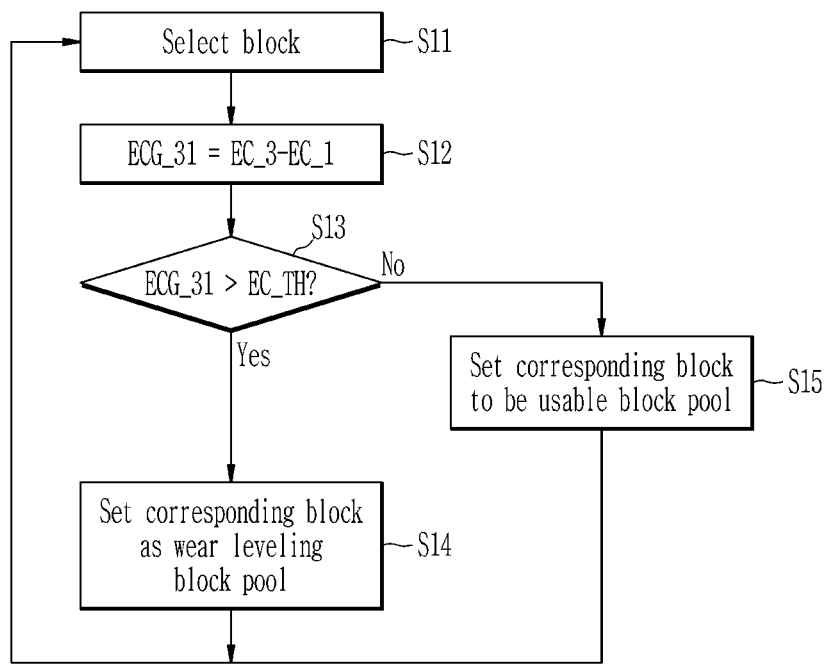
FIG. 13 shows a flowchart of a method for configuring a wear leveling block pool according to an example embodiment.

FIG. 13 shows a flowchart of a method for configuring a wear leveling block pool according to an example embodiment.

As shown in FIG. 13, the block pool manager 840 may select one of the entire blocks in operation S11. Regarding the block selected in operation S11, the first sub-block may be in a valid state, and the second sub-block and third sub-block may be in an invalid state.

The block pool manager 840 may calculate an EC gap ECG_31 that is a difference between the EC value EC_3 of the third sub-block of the block selected in operation S11 and the EC value EC_1 of the first sub-block in operation S12. The block pool manager 840 may read the EC values of the respective sub-blocks of the block selected in operation S11 from the erase count register 850.

The block pool manager 840 may determine whether the EC gap ECG_31 is greater than a predetermined threshold value EC_TH in operation S13.

When the EC gap ECG_31 is greater than a threshold value EC_TH according to a determination result of operation S13, the block pool manager 840 may set the corresponding block to be a block that belongs to the wear leveling block pool 1100 in operation S14. In detail, the block pool manager 840 may set the corresponding block to be a block that belongs to the second block group 1120 of the wear leveling block pool 1100.

When the EC gap ECG_31 is equal to or less than a threshold value EC_TH according to a determination result of operation S13, the block pool manager 840 may set the corresponding block to be a block that belongs to the usable block pool 900 in operation S15. In detail, the block pool manager 840 may set the corresponding block to be a block that belongs to the third block group 930 in the wear leveling block pool 900.

The above-noted operations S11 to S15 may be applied to the block of the same type from among all blocks. The same type may include a case in which the first sub-block is in a valid state and the second sub-block and the third sub-block are in an invalid state.

Figure 14:
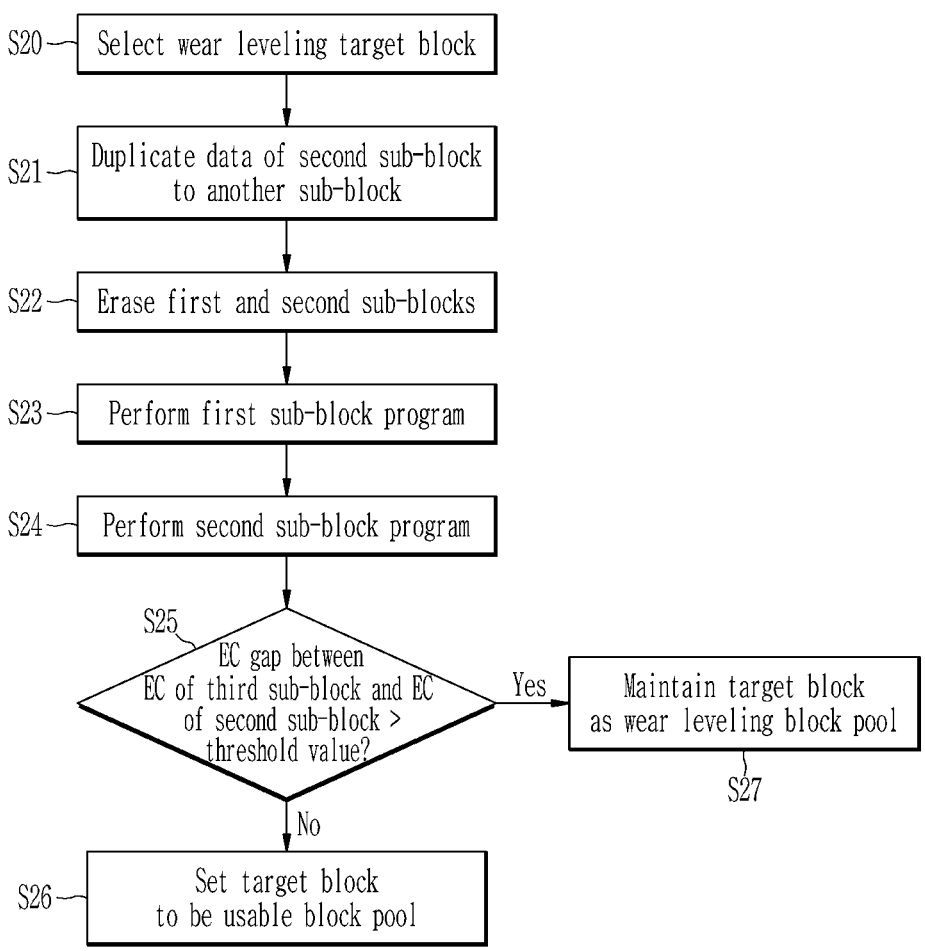
FIG. 14 shows a flowchart of a wear leveling method according to an example embodiment.

FIG. 14 shows a flowchart of a wear leveling method according to an example embodiment.

FIG. 14 shows a method for the wear leveling module 830 to perform wear leveling on the first block group 1110 in the wear leveling block pool 1100.

The wear leveling module 830 may select a wear leveling target block that has a small EC value and has a large EC gap among the sub-blocks from among the blocks that belong to the first block group 1110 in operation S20. The wear leveling target block will be simply referred to as a target block hereinafter.

The wear leveling module 830 may duplicate data of the second sub-block of the target block to another sub-block in operation S21. In detail, the wear leveling module 830 may generate a wear leveling request WREQ and an address WADDR of another sub-block and may provide the same to the transaction scheduler 860, and the transaction scheduler 860 may read the data of the second sub-block of the target block according to the request WREQ and the address WADDR, may generate a command CMD for writing to another sub-block, and may transmit the same together with the address ADDR to the non-volatile memory 300. The non-volatile memory 300 may be operated according to the command CMD to perform operation S21.

The wear leveling module 830 may erase the first and second sub-blocks of the target block in operation S22. In detail, the wear leveling module 830 may provide the erase request WREQ and the addresses WADDR of the first and second sub-blocks of the target block to the transaction scheduler 860, and the transaction scheduler 860 may generate a command CMD for erasing the data of the first sub-block and the second sub-block of the target block according to the erase request WREQ and the addresses WADDR and may transmit the same together with the address ADDR to the non-volatile memory 300. The non-volatile memory 300 may be operated according to the command CMD to perform operation S22.

The target block may be programmed in response to the data write request from the host, the data write request for garbage collection, and the data write request for wear leveling after operation S22. The first sub-block of the target block may be programmed in operation S23. When a data write request is needed after operation S23 or at least two sub-blocks are needed for data writing in operation S23, the first sub-block of the target block may be programmed, and the second sub-block of the target block may be programmed in operation S24.

After operation S24, the wear leveling module 830 may determine whether the EC gap between the EC of the third sub-block and the EC of the second sub-block is greater than a threshold value in operation S25.

When the EC gap is equal to or less than the threshold value in operation S25, the wear leveling module 830 may set the target block to belong to the usable block pool 900 in operation S26.

When the EC gap is greater than the threshold value in operation S25, the wear leveling module 830 may maintain the target block in the wear leveling block pool 1100 in operation S27.

After operation S27, the target block may belong to one of the first to third block groups of the wear leveling block pool 1100 by the block pool manager 840. For example, the first sub-block may be in an invalid state and the target block may belong to the first block group 1110, the second sub-block may be in an invalid state and the target block may belong to the second block group 1120, or the first and second sub-blocks may maintain the valid state and the target block may belong to the third block group 1130.

Figure 15:
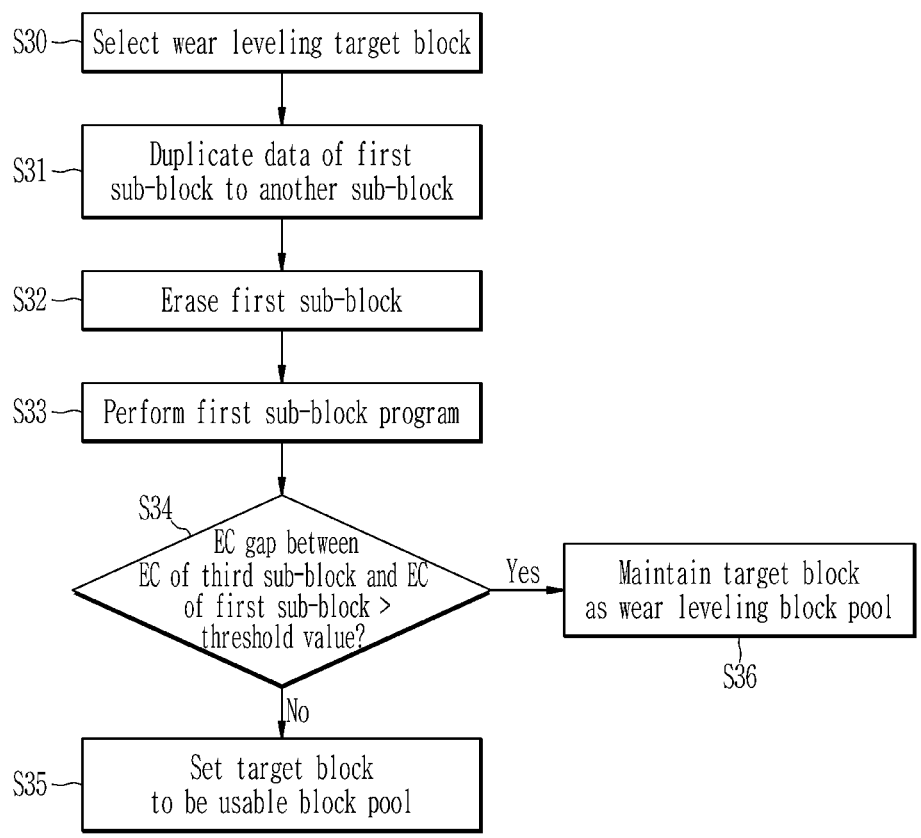
FIG. 15 shows a flowchart of a wear leveling method according to an example embodiment.

FIG. 15 shows a flowchart of a wear leveling method according to an example embodiment.

FIG. 15 shows a method for the wear leveling module 830 to perform wear leveling on the second block group 1120 in the wear leveling block pool 1100.

The wear leveling module 830 may select the wear leveling target block of which the EC value is small and the EC gap between the sub-blocks is large from among the blocks belonging to the second block group 1120 in operation S30.

The wear leveling module 830 may duplicate the data of the first sub-block of the target block to another sub-block in operation S31. In detail, the wear leveling module 830 may generate a wear leveling request WREQ and an address WADDR of another sub-block and may provide the same to the transaction scheduler 860, and the transaction scheduler 860 may generate a command CMD for reading data of the first sub-block of the target block and writing the same to another sub-block according to the request WREQ and the address WADDR and may transmit the same together with the address ADDR to the non-volatile memory 300. The non-volatile memory 300 may be operated according to the command CMD to perform operation S31.

The wear leveling module 830 may erase the first sub-block of the target block in operation S32. In detail, the wear leveling module 830 may provide the erase request WREQ and the address WADDR of the first sub-block of the target block to the transaction scheduler 860, and the transaction scheduler 860 may generate a command CMD for erasing data of the first sub-block of the target block according to the erase request WREQ and the address WADDR and may transmit the same together with the address ADDR to the non-volatile memory 300. The non-volatile memory 300 may be operated according to the command CMD to perform operation S32.

After operation S32, the target block may be programmed according to the data write request from the host, the data write request for garbage collection, and the data write request for wear leveling. The first sub-block of the target block may be programmed in operation S33.

After operation S33, the wear leveling module 830 may determine whether the EC gap between the EC of the third sub-block and the EC of the first sub-block is greater than a threshold value in operation S34.

When the EC gap is equal to or less than the threshold value in operation S34, the wear leveling module 830 may set the target block to belong to the usable block pool 900 in operation S35.

When the EC gap is greater than the threshold value in operation S34, the wear leveling module 830 may maintain the target block in the wear leveling block pool 1100 in operation S36. After operation S36, the target block may be maintained in the first block group 1110 of the wear leveling block pool 1100, or the first sub-block may be in an invalid state and may belong to the usable block pool 900.

Figure 16:
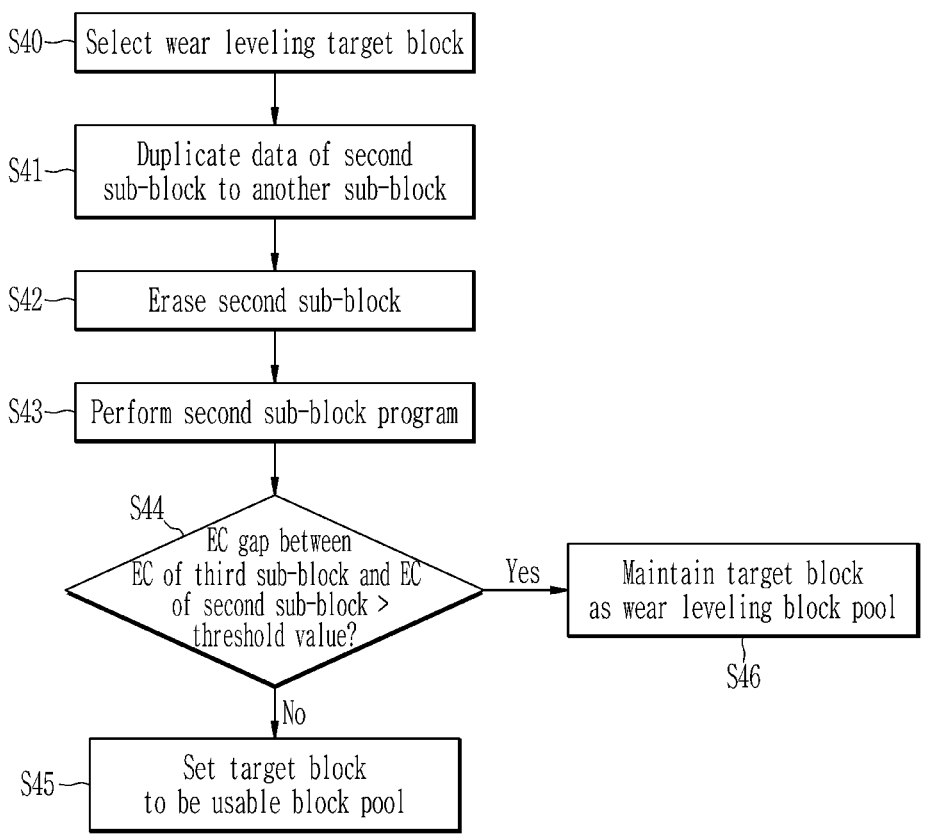
FIG. 16 shows a flowchart of a wear leveling method according to an example embodiment.

FIG. 16 shows a flowchart of a wear leveling method according to an example embodiment.

FIG. 16 shows a method for the wear leveling module 830 to perform wear leveling on the third block group 1130 in the wear leveling block pool 1100.

The wear leveling module 830 may select the wear leveling target block of which the EC value is small and the EC gap between the sub-blocks is large from among the blocks belonging to the third block group 1130 in operation S40.

The wear leveling module 830 may duplicate the data of the second sub-block of the target block to another sub-block in operation S41. In detail, the wear leveling module 830 may generate a wear leveling request WREQ and an address WADDR of another sub-block and may provide the same to the transaction scheduler 860, and the transaction scheduler 860 may generate a command CMD for reading data of the second sub-block of the target block and writing the same to another sub-block according to the request WREQ and the address WADDR and may transmit the same together with the address ADDR to the non-volatile memory 300. The non-volatile memory 300 may be operated according to the command CMD to perform operation S41.

The wear leveling module 830 may erase the second sub-block of the target block in operation S42. In detail, the wear leveling module 830 may provide the erase request WREQ and the address WADDR of the second sub-block of the target block to the transaction scheduler 860, and the transaction scheduler 860 may generate a command CMD for erasing data of the second sub-block of the target block according to the erase request WREQ and the address WADDR and may transmit the same together with the address ADDR to the non-volatile memory 300. The non-volatile memory 300 may be operated according to the command CMD to perform operation S42.

After operation S42, the target block may be programmed according to the data write request from the host, the data write request for garbage collection, and the data write request for wear leveling. The second sub-block of the target block may be programmed in operation S43.

After operation S43, the wear leveling module 830 may determine whether the EC gap between the EC of the third sub-block and the EC of the second sub-block is greater than a threshold value in operation S44.

When the EC gap is equal to or less than the threshold value in operation S44, the wear leveling module 830 may set the target block to belong to the usable block pool 900 in operation S45.

When the EC gap is greater than the threshold value in operation S44, the wear leveling module 830 may maintain that target block in the wear leveling block pool 1100 in operation S46.

After operation S46, the target block may belong to one of the first to third block groups of the wear leveling block pool 1100 according to the block pool manager 840. For example, the first sub-block may be in an invalid state and the target block may belong to the first block group 1110, the second sub-block may be in an invalid state and the target block may belong to the second block group 1120, or the first and second sub-blocks may be maintained in an valid state and the target block may belong to the third block group 1130.

As described above, a sub-block-based wear leveling may be performed on the sub-blocks configuring the block as well as block-based wear leveling on the block in the multi-stack structure.

While aspects of example embodiments have been particularly shown and described, it will be understood that various changes in form and details may be made therein without departing from the spirit and scope of the following claims.

What is claimed is:

1. A memory storage device comprising:
   a memory device comprising a plurality of blocks, the plurality of blocks comprising a first block which comprises a plurality of sub-blocks; and
   a memory controller comprising a register configured to store erase count (EC) values of the plurality of sub-blocks, wherein the memory controller is configured to update the register based on erase operations performed on the plurality of sub-blocks, identify differences between the EC values of the plurality of sub-blocks as use amount differences, and based on the use amount differences among the plurality of sub-blocks being greater than a threshold value, increase a use amount of a low use sub-block that has a small use amount from among the plurality of sub-blocks of the first block,
   wherein the plurality of sub-blocks of the respective blocks are stacked in a direction perpendicular to a substrate of the memory device.

2. The memory storage device of claim 1, wherein the plurality of sub-blocks of the first block comprises a first sub-block, a second sub-block and a third sub-block, and
   wherein the memory controller is further configured to increase a first use amount of the first sub-block or a second use amount of the second sub-block based on a difference between a third use amount of the third sub-block and the first use amount of the first sub-block being greater than the threshold value, or based on a difference between the third use amount of the third sub-block and the second use amount of the second sub-block being greater than the threshold value.

3. The memory storage device of claim 2, wherein the first sub-block and the second sub-block are provided between the substrate and the third sub-block.

4. The memory storage device of claim 2, wherein the memory controller is further configured to control the memory device to duplicate valid data to another block of the first sub-block, erase the first sub-block, and convert the first sub-block into a free sub-block, based on the difference between the third use amount of the third sub-block and the first use amount of the first sub-block being greater than the threshold value.

5. The memory storage device of claim 4, wherein the memory controller is further configured to allocate the first sub-block to a logic block that corresponds to a data write request, and map a physical address of the first sub-block to a logical address of the logic block based on the difference between the third use amount of the third sub-block and the first use amount of the first sub-block being greater than the threshold value.

6. The memory storage device of claim 2, wherein the memory controller is further configured to control the memory device to duplicate valid data of the second sub-block to another block, erase the first sub-block and the second sub-block, and convert the first sub-block and the second sub-block into free sub-blocks, based on the difference between the third use amount of the third sub-block and the second use amount of the second sub-block being greater than the threshold value, and the first sub-block being in an invalid state.

7. The memory storage device of claim 6, wherein the memory controller is further configured to allocate the first sub-block to a first logic block corresponding to a first data write request and map a physical address of the first sub-block to a logical address of the first logic block, and allocate the second sub-block to a second logic block corresponding to a second data write request and map a physical address of the second sub-block to a logical address of the second logic block.

8. The memory storage device of claim 2, wherein the memory controller is further configured to control the memory device to duplicate valid data of the second sub-block to another block, erase the second sub-block, and convert the second sub-block into a free sub-block based on the difference between the third use amount of the third sub-block and the second use amount of the second sub-block being greater than the threshold value, and the first sub-block being in a valid state.

9. The memory storage device of claim 8, wherein the memory controller is further configured to allocate the second sub-block to a logic block corresponding to a data write request and map a physical address of the second sub-block to a logical address of the logic block based on the difference between the third use amount of the third sub-block and the second use amount of the second sub-block being greater than the threshold value, and the first sub-block being in the valid state.

10. The memory storage device of claim 1, wherein the memory controller is further configured to identify the first block based on an EC value of the first block being smaller than EC values of other blocks among the plurality of blocks.

11. A memory storage device comprising:
    a memory device comprising a plurality of blocks, the plurality of blocks comprising a first block and an additional block, and the first block comprising a first sub-block, a second sub-block and a third sub-block sequentially stacked on a substrate; and
    a memory controller configured to control the memory device to duplicate data of the first sub-block or the second sub-block to the additional block, erase the first sub-block or the second sub-block, and program the first sub-block or the second sub-block, based on the third sub-block being in an invalid state.

12. The memory storage device of claim 11, wherein memory controller is further configured to control the memory device to duplicate the data of the first sub-block or the second sub-block to the additional block, erase the first sub-block or the second sub-block, and program the first sub-block or the second sub-block, based on the third sub-block being in the invalid state and an erase count (EC) gap indicating a difference between a first EC value of the first sub-block and a third EC value of the third sub-block, or a difference between a second EC value of the second sub-block and the third EC value being greater than a threshold value.

13. The memory storage device of claim 12, wherein the memory controller is further configured to control the memory device to sequentially erase the first sub-block and the second sub-block, and sequentially program the first sub-block and the second sub-block based on the EC gap indicating the difference between the second EC value of the second sub-block and the third EC value of the third sub-block being greater than the threshold value, and the first sub-block being in the invalid state.

14. The memory storage device of claim 12, wherein the memory controller is further configured to control the memory device to erase the second sub-block and program the second sub-block based on the EC gap indicating the difference between the second EC value of the second sub-block and the third EC value of the third sub-block being greater than the threshold value, and the first sub-block being in a valid state.

15. The memory storage device of claim 12, wherein the memory controller is further configured to control the memory device to erase the first sub-block and program the first sub-block based on the EC gap indicating the difference between the first EC value of the first sub-block and the third EC value of the third sub-block being greater than the threshold value.

16. The memory storage device of claim 11, wherein the first sub-block, the second sub-block, and the third sub-block are stacked in order on the substrate.

17. A wear leveling method of a memory storage device including a first block and a second block, the first block including a first sub-block and a second sub-block, the wear leveling method comprising:
   identifying an erase count (EC) gap indicating a difference between a second EC value of the second sub-block and a first EC value of the first sub-block;
   duplicating data of the first sub-block to the second block based on the EC gap being greater than a threshold value;
   erasing the data of the first sub-block based on the EC gap being greater than the threshold value; and
   programming the first sub-block based on the EC gap being greater than the threshold value.

18. The wear leveling method of claim 17, further comprising:
   erasing the first sub-block based on the EC gap being greater than the threshold value and the first sub-block being in an invalid state;
   programming the first sub-block; and
   programming the second sub-block after the programming the first sub-block.

19. The wear leveling method of claim 17, wherein the memory storage device includes a plurality of blocks, and the plurality of blocks includes the first block and the second block, and
   wherein the wear leveling method further comprises setting a wear leveling block pool comprising identified blocks, from among the plurality of blocks, including sub-blocks of which corresponding EC gaps are greater than the threshold value.

* * * * *